(12) United States Patent
Yamamoto et al.

(10) Patent No.: US 7,665,916 B2
(45) Date of Patent: Feb. 23, 2010

(54) COATER/DEVELOPER AND COATING/DEVELOPING METHOD

(75) Inventors: Taro Yamamoto, Koshi (JP); Hideharu Kyouda, Kikuyo-Machi (JP)

(73) Assignee: Tokyo Electron Limited, Tokyo-to (JP)

( * ) Notice: Subject to any disclaimer, the term of this patent is extended or adjusted under 35 U.S.C. 154(b) by 545 days.

(21) Appl. No.: 10/590,314

(22) PCT Filed: Dec. 16, 2004

(86) PCT No.: PCT/JP2004/018831

§ 371 (c)(1),
(2), (4) Date: Aug. 23, 2006

(87) PCT Pub. No.: WO2005/101467

PCT Pub. Date: Oct. 27, 2005

(65) Prior Publication Data

US 2007/0177869 A1    Aug. 2, 2007

(30) Foreign Application Priority Data

Mar. 31, 2004  (JP) .............................. 2004-107195

(51) Int. Cl.
G03D 5/00   (2006.01)
B05C 11/02  (2006.01)
B08B 3/00   (2006.01)

(52) U.S. Cl. ...................... 396/611; 118/52; 134/95.3; 134/144

(58) Field of Classification Search ................. 396/611; 355/27, 30, 53; 134/95.3, 144, 157, 902; 118/52

See application file for complete search history.

(56) References Cited

U.S. PATENT DOCUMENTS

| 5,610,683 | A  | * | 3/1997 | Takahashi ..................... 355/53 |
| 6,063,439 | A  |   | 5/2000 | Semba et al. |
| 6,443,641 | B2 | * | 9/2002 | Takamori et al. ............ 396/579 |
| 6,558,053 | B2 | * | 5/2003 | Shigemori et al. .......... 396/611 |

(Continued)

FOREIGN PATENT DOCUMENTS

JP    59 011628    1/1984

(Continued)

OTHER PUBLICATIONS

English translation of JP 10-303114 (dated Nov. 13, 1998).*

(Continued)

*Primary Examiner*—Alan A Mathews
(74) *Attorney, Agent, or Firm*—Oblon, Spivak, McClelland, Maier & Neustadt, L.L.P.

(57) ABSTRACT

Accurate coating and developing having high intrasurface uniformity is achieved by suppressing the influence of components of a resist that may be eluted while a substrate coated with the resist is processed by immersion exposure. A coating unit coats a surface of a substrate with a resist. then, a first cleaning means including a cleaning nozzle cleans the substrate and then the substrate is subjected to an exposure process. Since only a small amount of components of the resist dissolves in a transparent liquid layer formed on the substrate for exposure, an exposure process can form lines in accurate line-widths. Consequently, a resist pattern of lines having accurate line-widths having high intrasurface uniformity can be formed on the substrate by developing the exposed resist.

17 Claims, 15 Drawing Sheets

U.S. PATENT DOCUMENTS

2003/0079764 A1    5/2003    Hirose et al.

FOREIGN PATENT DOCUMENTS

| | | |
|---|---|---|
| JP | 08 314156 | 11/1996 |
| JP | 10 303114 | 11/1998 |
| JP | 11 074195 | 3/1999 |
| JP | 11 260686 | 9/1999 |
| JP | 2003 076018 | 3/2003 |
| JP | 2003 332213 | 11/2003 |
| JP | 2004 095705 | 3/2004 |

OTHER PUBLICATIONS

English translation of JP 2004-095705 (dated Mar. 25, 2004).*

* cited by examiner

COATER/DEVELOPER AND COATING/DEVELOPING METHOD

TECHNICAL FIELD

A photoresist pattern forming process included in a semiconductor device fabricating process forms a resist film on a surface of a semiconductor wafer (hereinafter, referred to simply as "wafer"), exposes the resist film to radiation in a predetermined pattern, and processes the exposed resist film by a developing process to form a resist pattern. These processes are carried out by a processing system formed by connecting an exposure system to a coating and developing system that applies a resist to a surface of a wafer in a resist film and develops the exposed resist film.

Progressive growth of minuteness of device patterns and progressive reduction of the thickness of thin films in recent years strongly demand improvement of resolution of the exposure process. To meet such a demand, techniques for extreme ultraviolet lithography (EUVL), electron projection lithography (EPL) and exposure using fluorine dimers ($F_2$) have been developed. To improve the resolution of the existing exposure techniques using argon fluoride (ArF) and krypton fluoride (krF) as light sources, studies have been made of an exposure method that forms a transparent liquid layer on a surface of a substrate, which will be called a immersion exposure method. The semiconductor industry and the semiconductor device fabricating system industry have a strong tendency to extend the life of ArF exposure systems as long as possible because of financial reasons. Some has an opinion that the ArF exposure system will be used for a process requiring a resolution not smaller than 45 nm and the practical application of EUVL may be postponed. The immersion exposure method makes light travel through pure water to utilize the wavelength reducing effect of water. Wavelength of 193 nm of ArF light is reduced substantially to 134 nm in water.

An exposure system capable of carrying out the immersion exposure method will be briefly described with reference to FIG. 18. Referring to FIG. 18, an exposure apparatus 1 is disposed opposite to a surface of a wafer W, namely, a substrate, held in a horizontal position by a wafer holding mechanism, not shown. A lens 10 attached to the tip of a lens holder of the exposure apparatus 1 is spaced by a gap from the surface of the wafer W. The lens holder is provided with a pouring port 11 and a suction port 12 at positions near the circumference of the lens 10. A solution, such as water, is poured onto the surface of the wafer W through the pouring port 11. Water poured onto the surface of the wafer W is sucked up through the suction port 12 to recover the water. Water is supplied through the pouring port 11 onto the surface of the wafer W and, at the same time, water is sucked through the suction port 12 to form a liquid film, namely, a water film, between the lens 10 and the surface of the wafer W. Light emitted by a light source, not shown, and traveled through the lens 10 falls on the wafer W. Thus a resist film is exposed to light in a predetermined circuit pattern. Then, the exposure apparatus 1 is translated laterally to a position corresponding to the next exposure region 13, namely, a shot region 13, and the next cycle of an irradiating operation is performed. The irradiating operation is repeated to print the circuit pattern successively on shot regions 13 on the surface of the resist film formed on the wafer W. In FIG. 18, the shot regions 13 are shown in an enlarged view.

DISCLOSURE OF THE INVENTION

Problem to be Solved by the Invention

The immersion exposure method, however, has the following problems. When a water film is formed on the surface of the resist film for immersion exposure, it possible that some of the components of the resist film dissolve in water, though slightly. The components that may dissolve in water are, for example, an acid generator, such as a photo acid generator (PAG), and a quencher. The dissolved components adhered to the surface of the lens 10 will deteriorate the accuracy of the line-width of the circuit pattern. Even if the dissolved components do not adhere to the surface of the lens 10, it is possible that the water film containing the dissolved components affects the refractive index of the water film to lower resolution and to cause the variation of line-width of the circuit pattern. Generally resist films of resists for ArF light are water-repellent. However, those resist films are not perfectly water-repellent and hence are subject to the foregoing problem.

The present invention has been made in view of the foregoing circumstances and it is therefore an object of the present invention to provide a coating and developing method of processing a substrate to be subjected to immersion exposure and a system for carrying out the coating and developing method, capable of suppressing the influence of components dissolved in water and of achieving accurate, uniform coating and developing processes.

Means for Solving the Problem

A coating and developing system according to the present invention includes: a coating unit for coating a surface of a substrate with a resist, and a developing unit for processing the substrate by a developing process after exposing the substrate coated with a transparent liquid layer, characterized by a first cleaning means for cleaning the surface of the substrate coated with the resist with a cleaning liquid before exposure.

The coating unit may include a substrate holding device capable of holding the substrate, for example, in a horizontal position and of rotating the substrate about a vertical axis, a resist pouring nozzle for pouring the resist onto the surface of the substrate held by the substrate holding device, and the first cleaning means may include a cleaning liquid pouring nozzle for pouring a cleaning liquid onto the surface of the substrate held by the substrate holding device. The first cleaning means may include a closely closable vessel capable of holding the wafer therein, a substrate support device disposed in the closely closable vessel to support the substrate in a horizontal position thereon, a cleaning liquid supply means for supplying a cleaning liquid into the closely closable vessel, and a cleaning liquid discharging means for discharging the cleaning liquid. The coating and developing system may further include a heating unit for heating the surface of the substrate coated with the resist, and the first cleaning means may be adjacent to the heating unit. The coating and developing system may further include a drying means for drying the substrate by flowing a dry gas through the closely closable vessel after the cleaning liquid has been discharged from the closely closable vessel.

The first cleaning means may include a substrate holding device for holding the substrate in a horizontal position, a cleaning nozzle provided with pouring openings arranged along the width of the substrate to pour the cleaning liquid onto the surface of the substrate held by the substrate holding device and suction openings arranged adjacently to the pouring openings on the front and/or the back side of the pouring openings to suck up the cleaning liquid from the surface of the substrate, and a cleaning nozzle moving means for horizontally moving the cleaning nozzle relative to the substrate holding device. The first cleaning means may be provided with a drying means for removing the cleaning liquid remaining on the substrate to dry the substrate.

The coating and developing system may further include an interface unit for transferring the substrate coated with the resist to an exposure system and receiving the exposed substrate from the exposure system, wherein the first cleaning means may be included in the interface unit. The coating and developing system may further include a second cleaning means for cleaning the surface of the exposed substrate with a cleaning liquid before subjecting the substrate to a developing process. In the coating and developing system, the first cleaning means may serve also as the second cleaning means.

A coating and developing method according to the present invention includes: a coating process for coating a surface of a substrate with a resist, a first cleaning process for cleaning the surface of the substrate coated with the resist with a cleaning liquid before exposure, an exposure process for exposing the surface of the substrate coated with a transparent liquid layer, and a developing process for developing the exposed surface of the substrate.

The coating process may include the step of supplying the resist onto the surface of the substrate held in a horizontal position by a substrate holding device, and the first cleaning process may include the step of pouring a cleaning liquid through a cleaning nozzle onto the surface of the substrate held by the substrate holding device. The first cleaning process may include the steps of: carrying the substrate into a closely closable vessel and holding the substrate in a horizontal position, cleaning a surface of the substrate by supplying a cleaning liquid into the closely closable vessel, and drying the substrate by flowing a drying gas through the closely closable vessel after discharging the cleaning liquid from the closely closable vessel.

The first cleaning process may move horizontally a cleaning nozzle provided with pouring openings through which a cleaning liquid is poured onto the surface of the substrate and may suck the cleaning liquid poured onto the substrate through suction openings arranged adjacently to the discharge openings on the front and/or the back side of the discharge openings. The coating and developing method may further include a drying process for drying the substrate after the first cleaning process and before the exposure process. The coating and developing method may further include a cleaning process for cleaning the surface of the exposed substrate with a cleaning liquid before the developing process.

According to the present invention, the surface of the substrate coated with the resist is cleaned with the cleaning liquid by the first cleaning means before subjecting the substrate to immersion exposure. Consequently, the amount of component of the resist that may dissolve in the liquid layer formed on the surface of the resist film for immersion exposure can be reduced. Thus the adhesion of the dissolved components to the surface of a lens to be brought into contact with the liquid layer through which the resist film is exposed to light and the influence of the dissolved components on the refraction of light in the liquid layer can be suppressed. Consequently, the resist film can be accurately formed in a highly uniform thickness on the substrate and the resist film can be accurately developed.

BEST MODE FOR CARRYING OUT THE INVENTION

Figure 1:
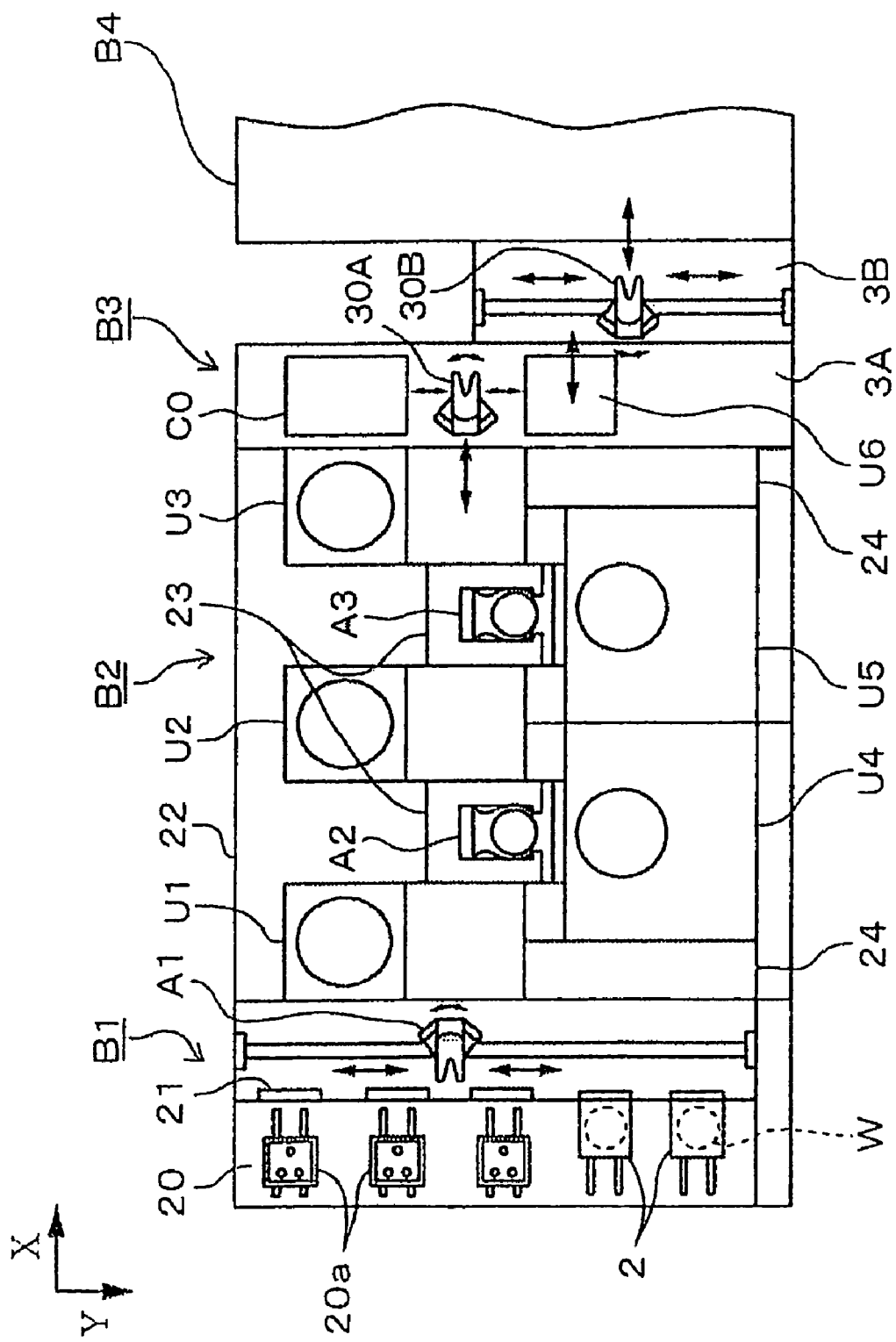
FIG. 1 is a schematic plan view of a coating and developing system in a first embodiment according to the present invention.
Figure 2:
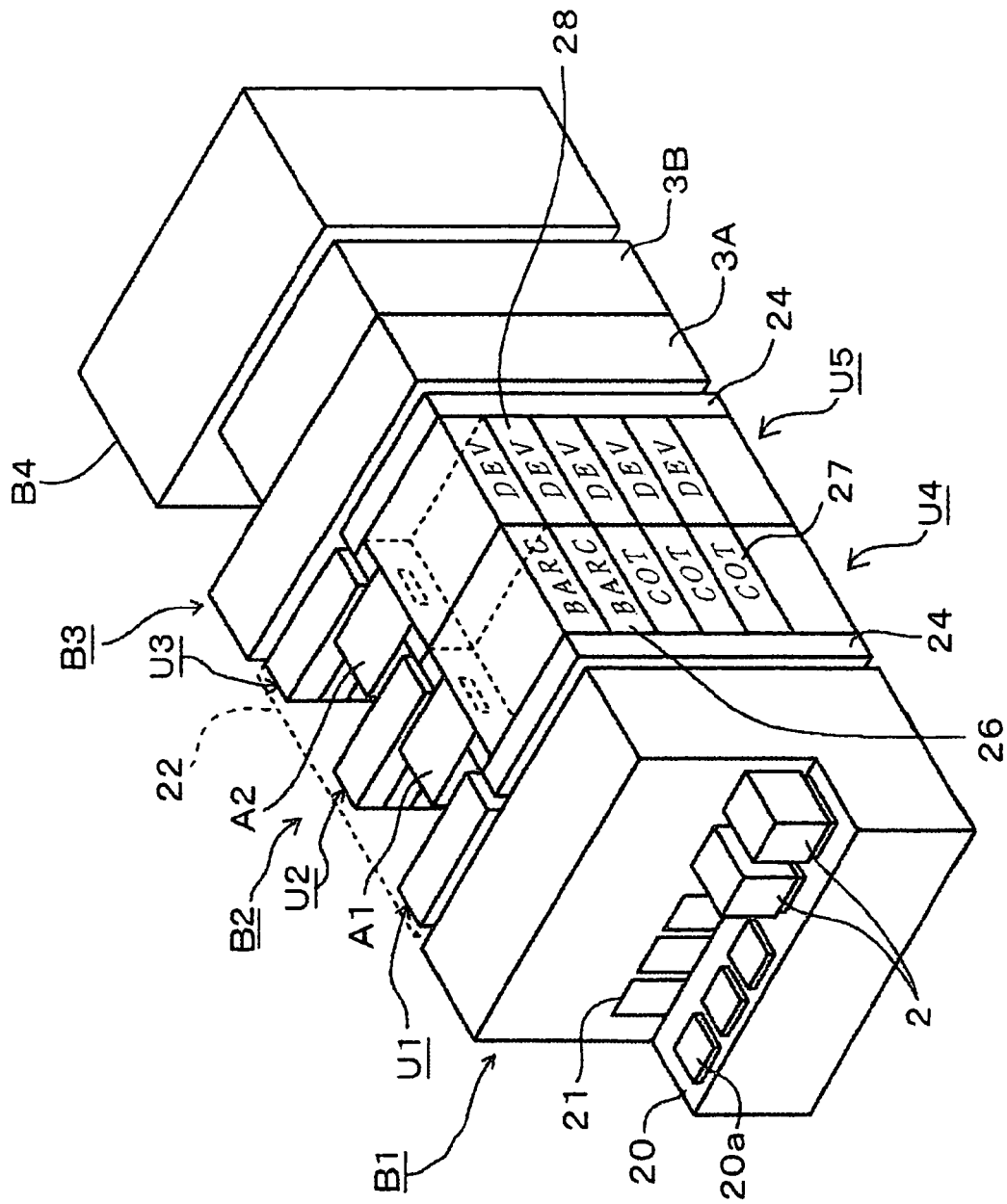
FIG. 2 is a perspective view of the coating and developing system sown in FIG. 1
Figure 3:
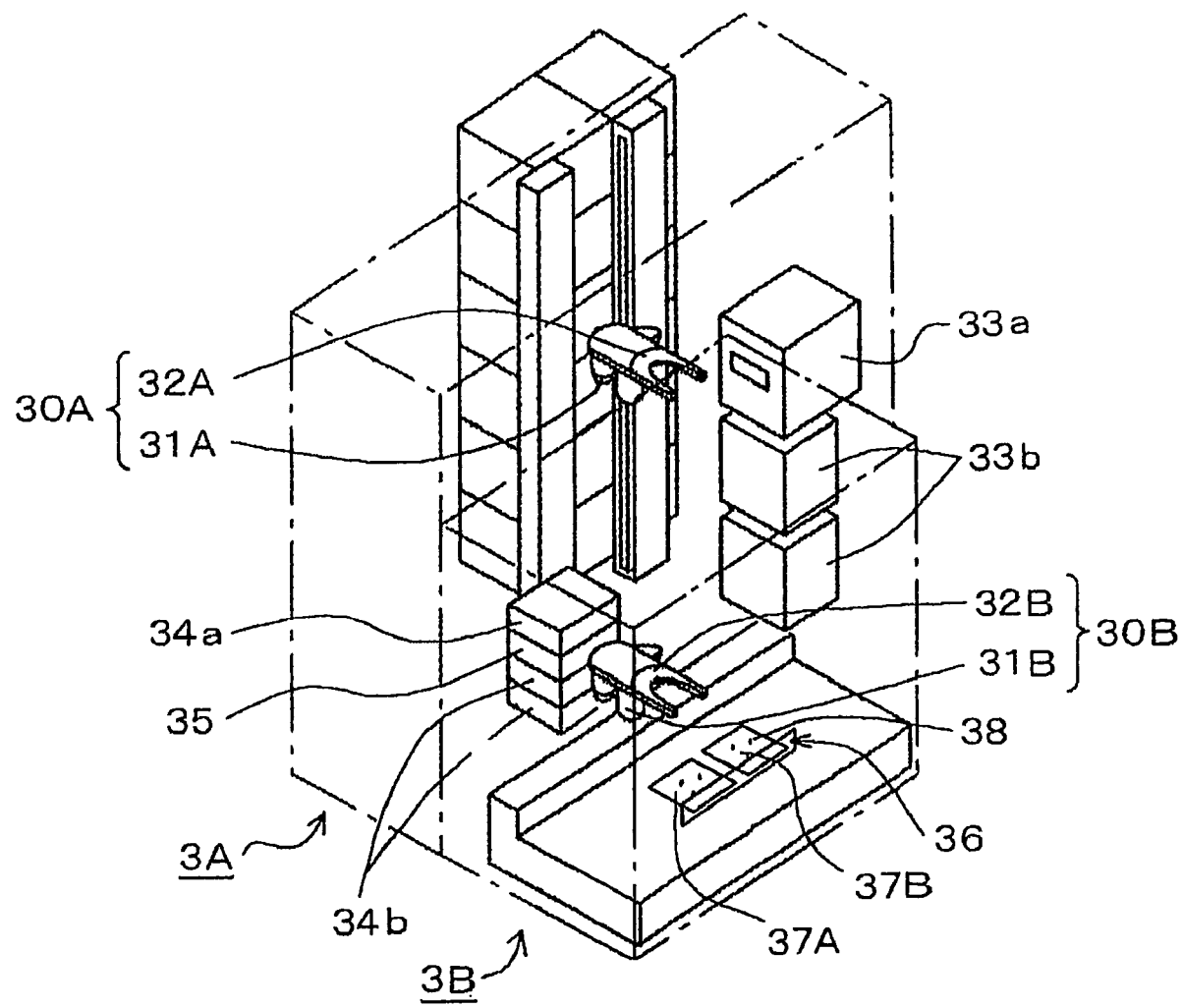
FIG. 3 is a perspective of an interface unit included in the coating and developing system shown in FIG. 1.

A resist pattern forming system built by connecting an exposure system to a coating and developing system in a first embodiment according to the present invention will be described with reference to FIGS. 1 to 3. A carrier transfer unit B1 receives and sends out a sealed carrier 2 containing, for example, thirteen wafers W, namely, substrates. The carrier transfer unit B1 has a carrier station 20 provided with a carrier table 20a capable of supporting a plurality of carriers 2 thereon, gates 21 formed in a wall in a front part of the carrier station 20a, and a transfer mechanism A1 for taking out the wafers W through the gate 21 from the carrier 2.

A processing unit B2 surrounded by a case 22 is connected to the front end of the carrier transfer unit B1. The processing unit B2 has shelf units U1, U2 and U3 each formed by stacking up heating/cooling units in layers, liquid-processing units U4 and U5, and main carrying devices A2 and A3 for transferring the wafer W from the shelf units U1, U2 and U3 to the liquid-processing units U4 and U5 and in reverse. Each of the main carrying devices A2 and A3 is disposed in a space surrounded by the side walls of the shelf units U1 and U2 (U2 and U3), the back wall of the liquid-processing unit U4 (U5) and a partition wall 23. Each of temperature and humidity regulating units 24 is provided with a temperature regulating device for regulating the temperatures of processing liquid to be used by the processing units and ducts for the regulation of temperature and humidity.

Each of the shelf units U1, U2 and U3 is formed by stacking up various units for the pretreatment of wafers before being processed by processes to be carried out by the liquid-processing units U4 and U5 and for the posttreatment of wafers after being processed by processes to be carried out by the liquid-processing units U4 and U5. The combination includes a heating unit (PAB) 25, not shown, for baking a wafer W and a cooling unit for cooling a wafer W. As shown in FIG. 2, the liquid-processing units U4 and U5 are formed by stacking up antireflection film forming units 26 (BARCs 26) for forming an antireflection film, coating units 27 (COTs 27), and developing units 28 (DEVs 28) for processing a wafer W by a developing process using a developer in, for example, five layers respectively on chemical solution containers containing a resist and a developer. This coating and developing system includes a first cleaning device for cleaning a wafer W having a surface coated with a resist with a cleaning liquid before exposure. In this embodiment, the first cleaning device is incorporated into the coating unit 27 (COT 27).

An interface unit B3 is disposed behind the shelf unit U3 of the processing unit B2. An exposure unit B4 is connected to the interface unit B3. As shown in FIG. 3, the interface unit B3 has a first carrying chamber 3A and a second carrying chamber 3B longitudinally arranged between the processing unit B2 and the exposure unit B4. A first substrate carrying device 30A and a second substrate carrying device 30B are installed in the first carrying chamber 3A and the second carrying chamber 3B, respectively. The first substrate carrying device 30A includes a base 31A capable of moving in vertical directions and of turning about a vertical axis, and a stretchable arm 32A mounted on the base 31A. The second substrate carrying device 30B includes a base 31B capable of moving in vertical directions and of turning about a vertical axis, and a stretchable arm 32B mounted on the base 31B.

In the first carrying chamber, an edge exposure device 33a (WEE 33a) for exposing only an edge part of a wafer W, and two buffer cassettes 33b are stacked up one on top of another on the left side, as viewed from the side of the carrier transfer unit B1. A transfer unit 34a (TRS3 34a), two precision temperature regulating units 34b (CPL2 34b) each provided with a cooling plate, and a heating and cooling unit 35 (PEB 35) for processing an exposed wafer W by a PEB process are arranged, for example, in a vertical arrangement on the right side. Transfer stages 37A and 37B are arranged laterally near the exposure unit B4 to support a wafer W to be transferred through a wafer transfer opening 36 formed on the side of the exposure unit B4 between the second carrying chamber 3B and the exposure unit B4. Each of the transfer stages 37A and 37B is provided with, for example, three support pins projecting upward to support a wafer W thereon.

Figure 4:
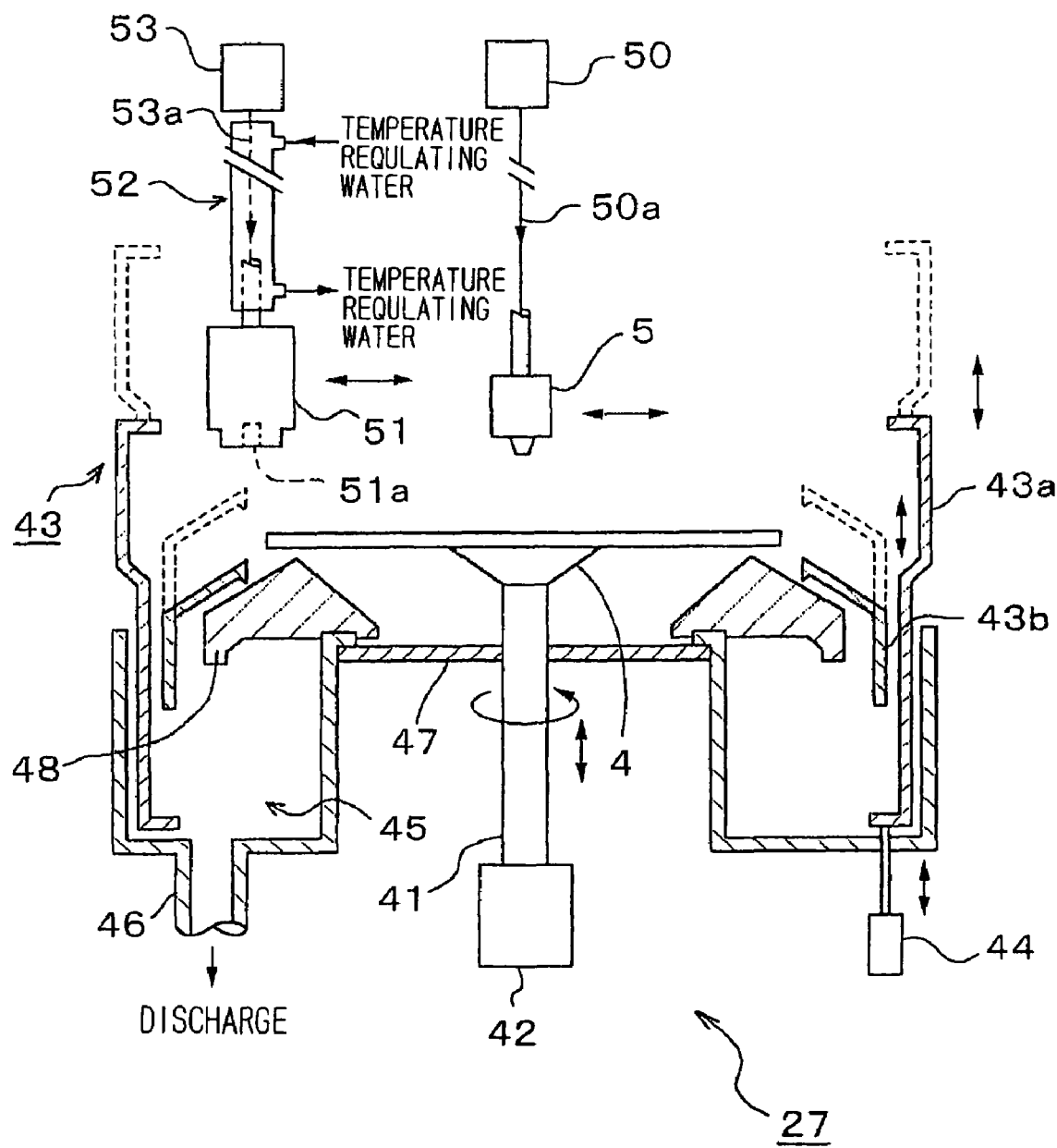
FIG. 4 is a longitudinal sectional view of a coating unit included in the coating and developing system shown in FIG. 1 and including a first cleaning device.

The coating unit 27 (COT 27) combined with the first cleaning device will be described with reference to FIGS. 4 and 5. A spin chuck 4, namely, a substrate holding device, attracts a central part of the back surface of a wafer W by suction and holds the wafer W in a horizontal position. The spin chuck 4 is able to rotate and to move vertically. The spin chuck 4 is connected to a driving mechanism 42 by a shaft 41. The driving mechanism 42 drives the spin chuck 4 holding a wafer W thereon for rotation and vertical movement. A cup 43 includes an outer cup 43a having an open upper end and an inner cup 43b having an open upper end. The cup 43 surrounds the wafer W held on the spin chuck 4. The outer cup 43a is moved vertically by a lifting device 44. When the outer cup 43a is raised, a step formed in a lower part of the outer cup 43a is engaged with the inner cup 43b, so that the outer cup 43a and the inner cup 43b are raised simultaneously. A liquid holder 45 defining an annular groove extending under the edge of the wafer W is placed below the cup 43. A discharge opening 46 is formed in the bottom wall of the liquid holder 45. A disk 47 is disposed under the wafer W and is surrounded by a ring 48.

A resist pouring nozzle 5 is disposed above the wafer W held on the spin chuck 4 opposite to a central part of the wafer W. The resist pouring nozzle 5 can be moved in lateral and vertical directions. The resist pouring nozzle 5 is connected to a resist source 50 by a resist supply line 50a. The resist supply line 50a is provided with a flow regulator, not shown. A cleaning liquid pouring nozzle 51, namely, a first cleaning means, is disposed opposite to the surface of the wafer W. The cleaning liquid pouring nozzle 51 is spaced from the surface of the wafer W by a gap. The cleaning liquid pouring nozzle 51 is provided with a cleaning liquid discharge slit 51a of a length equal to or greater than the diameter of the wafer W. The diameter of the wafer W corresponds to the width of a substrate. The cleaning liquid pouring nozzle 51 can be laterally moved. The cleaning liquid discharge opening 51a may be formed by linearly arranging discharge holes of a small diameter along the length of the cleaning liquid pouring nozzle 51.

The cleaning liquid pouring nozzle 51 is connected to a cleaning liquid source 53 for supplying a cleaning liquid, such as water, by a cleaning liquid supply line 53a provided with a flow regulator, not shown. The cleaning liquid pouring nozzle 51 is provided with a temperature regulator 52 for regulating the temperature of the cleaning liquid. More concretely, the cleaning liquid supply line 53a is a double-wall pipe having an inner pipe defining a liquid passage and an outer pipe defining an annular passage 52a for temperature regulating water surrounding the inner pipe. The temperature regulating water regulates the cleaning liquid. The temperature of the cleaning liquid is dependent on the type of the resist. The temperature of the cleaning liquid for cleaning a resist film of a resist that can be satisfactorily cleaned with a low-temperature cleaning liquid is, for example, 23° C. The temperature of the cleaning liquid for cleaning a resist film of a resist that can be satisfactorily cleaned with a high-temperature cleaning liquid is, for example, 50° C. A proper temperature of the cleaning liquid is determined through cleaning tests. Information about proper set temperatures respectively for different types of resists may be stored in a storage device included in a computer included in a controller, not shown, and the temperature regulator 52 may regulate the temperature of the cleaning liquid on the basis of the information read from the storage device.

Figure 5:
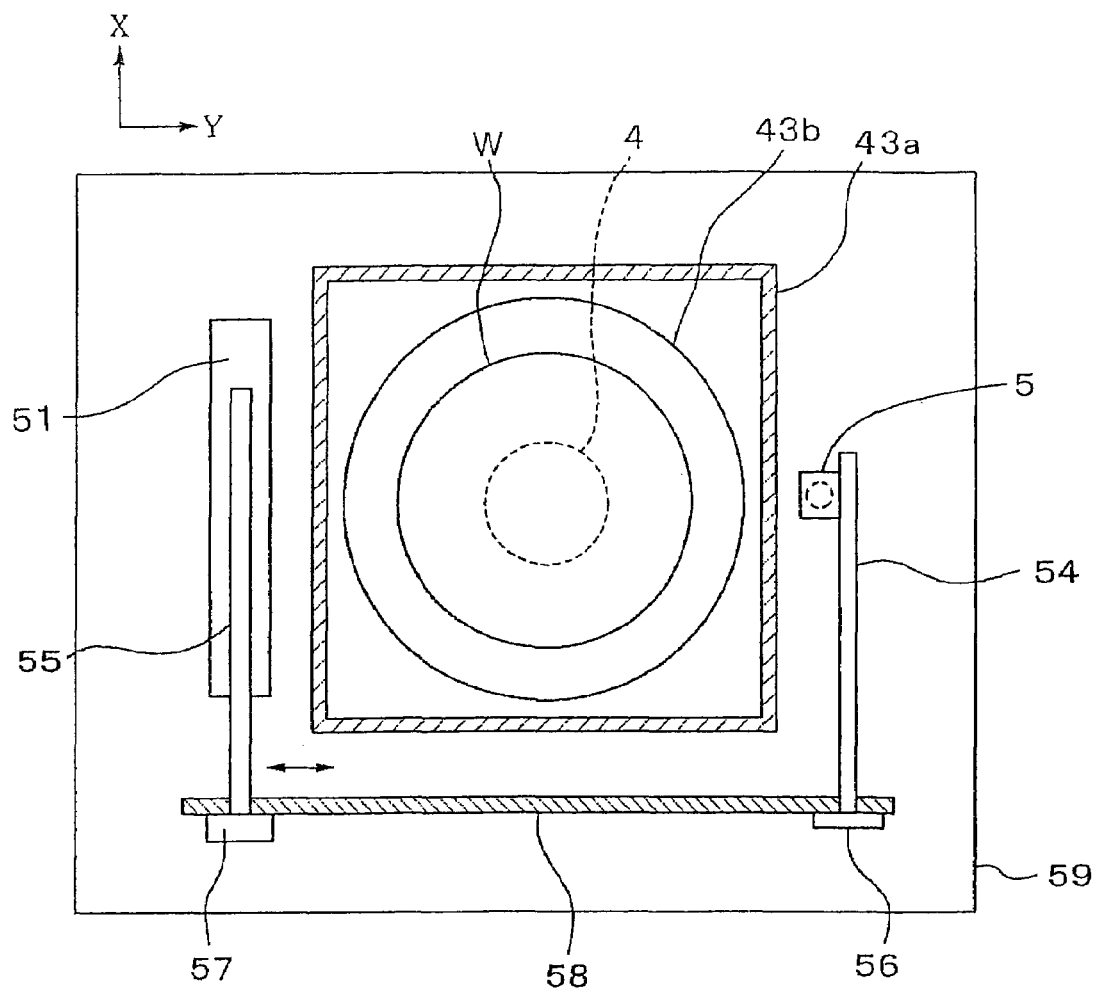
FIG. 5 is a plan view of the coating unit shown in FIG. 4.

Referring to FIG. 5, the resist pouring nozzle 5 and the cleaning liquid pouring nozzle 51 are supported on free ends of nozzle support arms 54 and 55, respectively. Base ends of the nozzle support arms 54 and 55 are connected to sliding members 56 and 57 provided with lifting mechanisms, not shown, respectively. The sliding members 56 and 57 slide laterally, for example, along a guide member extended in a Y-direction on the bottom of the casing of the unit. In FIG. 5, indicated at 59 is the outline of the casing of the coating unit 27 (COT) 27).

A heating unit 25 ((PAB 25) for processing a wafer W by a soft baking process, namely, a heating process, will be described with reference to FIG. 6. The heating unit 25 (PAB 25) is provided with a substrate support table 6 for supporting a wafer W thereon. The substrate support table 6 is internally provided with a heater 61, such as a resistance heating element. The substrate support table 6 serves as a heating plate for heating a wafer W supported on the substrate support table 6 by heat generated by the heater 61. Three retractable support pins 62 project upward from the upper surface of the substrate support table 6 to support a wafer W thereon so that the lower surface of the wafer W is spaced slightly from the upper surface of the substrate support table 6. The support pins 62 and the main carrying device A2 (A3) cooperate to transfer a wafer W to the substrate support table 6.

Figure 6:
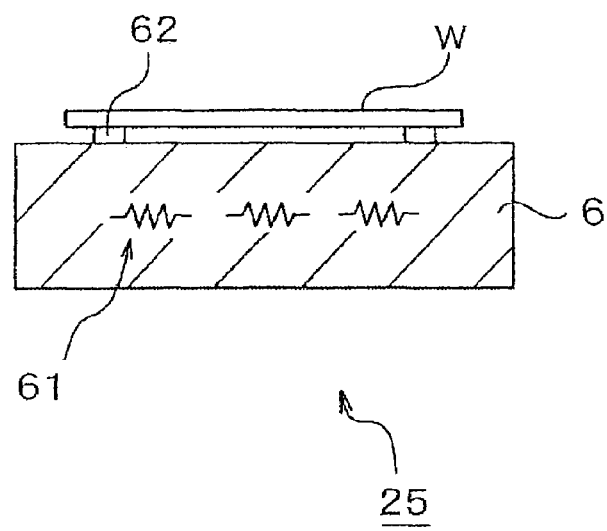
FIG. 6 is a longitudinal sectional view of a heating unit included in the coating and developing system shown in FIG. 1.

The heating and cooling unit 35 (PEB 35) for the postexposure heating of a wafer W after exposure is provided with a substrate support table, which corresponds to the substrate support table 6 shown in FIG. 6, and a cooling device for cooling a wafer W at a predetermined temperature before the wafer W is heated by the substrate support table. The construction of the developing unit 28 (DEV 28) is substantially the same as that of the coating unit 27 (COT 27) shown in FIGS. 4 and 5. The developing unit 28 is provided with a developer pouring nozzle similar to the cleaning liquid pouring nozzle 51.

Figure 7:
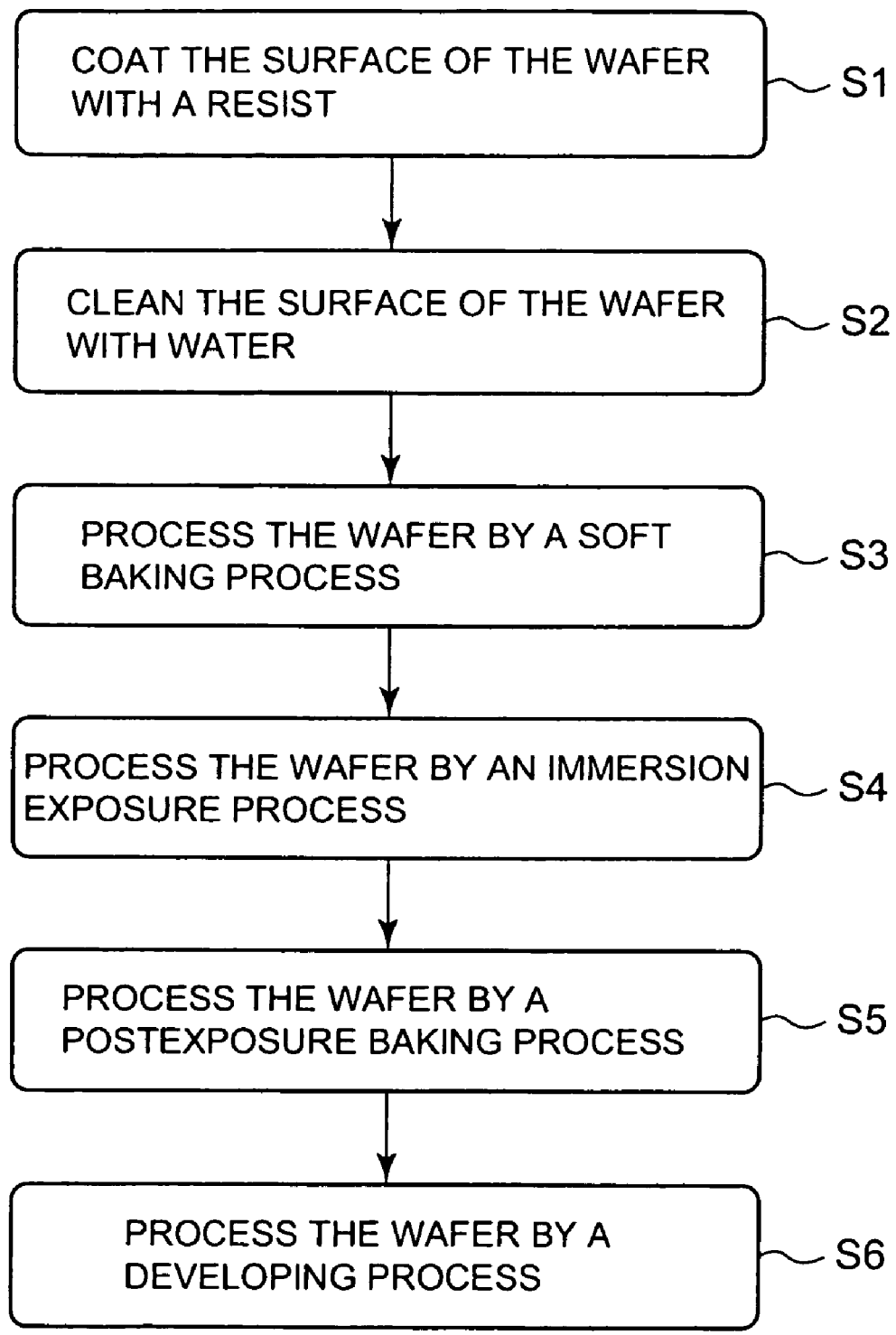
FIG. 7 is a flow chart of a wafer processing procedure to be carried out by the coating and developing system shown in FIG. 1.

A process to be carried out by the coating and developing system to process a wafer W, namely, a substrate, will be described with reference to a flow chart shown in FIG. 7. Coating and developing methods which will be described below are only examples and are not intended to place any restrictions on the present invention. A carrier 2 containing, for example, thirteen wafers W is delivered to the carrier table 20a. Then, the gate 21 and the lid of the carrier 2 are opened and the transfer mechanism A1 takes out a wafer W from the carrier 2. Then, the wafer W is transferred through a transfer unit, not shown, included in the shelf unit U1 to the main carrying device A2. An antireflection film is formed on a surface of the wafer W by the antireflection film forming unit 26 (BARC 26) before the wafer W is subjected to a coating process. The surface of the wafer W is processed by a process for providing the surface of the wafer W with a hydrophobic property, when necessary.

The main carrying device A2 carries the wafer into the coating unit 27 (COT 27). The wafer W is held by the spin chuck 4. The resist pouring nozzle 5 is disposed with its tip spaced a short distance from a central part of the surface of the wafer W. The spin chuck 4 holding the wafer W thereon is driven to rotate the wafer W about a vertical axis and a resist is poured at a predetermined pouring rate onto a central part of the surface of the wafer W. The resist poured onto the wafer W is caused to spread radially by centrifugal force. An excess part of the resist is expelled from the surface of the wafer W by centrifugal force. Consequently, the surface of the wafer W is coated with a thin liquid resist film in step S1. Then, the resist pouring nozzle 5 stops pouring the resist and the wafer W is rotated at a high rotating speed to dry the resist film by spin drying. The rotation of the wafer W at a high rotating speed promotes the evaporation of a solvent contained in the liquid resist film and a solid resist film is formed.

In step S2, the resist pouring nozzle 5 is retracted and the cleaning liquid pouring nozzle 51 is disposed at a position outside a first diametrical end of the wafer W. Then, a cleaning operation is performed. A cleaning liquid, such as water, is poured at a predetermined pouring rate through the cleaning liquid pouring nozzle 51 and the cleaning liquid pouring nozzle 51 is moved toward a second diametrical end, namely, the other diametrical end, of the wafer W. Soluble matters remaining on the surface of the wafer W, more strictly, on the surface of the resist film, are dissolved in the cleaning liquid poured onto the surface of the wafer W and the surface of the wafer W is cleaned. Then, the cleaning liquid pouring nozzle 51 is moved from the second toward the first diametrical end pouring the cleaning liquid onto the wafer W. This cleaning operation may be performed by two or three cycles. In some cases, the wafer W coated with the cleaning liquid is held stationary for a predetermined time in the range of 2 to 10 s. Then, the cleaning liquid pouring nozzle 51 is retracted, the outer cup 43a and the inner cup 43b are raised, and then the spin chuck 4 supporting the wafer W thereon is rotated at a high rotating speed to expel the cleaning liquid from the wafer by spin drying. A drying gas blowing nozzle for blowing a drying gas, such as dry air or dry nitrogen gas, may be placed in the unit and the wafer W may be more completely dried by blowing the drying gas against the wafer while the wafer W is held stationary or being rotated. Complete drying of the wafer W is effective in surely preventing the formation of water marks that affect adversely to exposure on the surface of the wafer W during soft baking.

After the wafer W has been dried, the main carrying device A2 caries the wafer W out of the coating unit 27 (COT 27), carries the wafer W into the heating unit 25 (PAB 25) and places the wafer W on the substrate support table 6. The substrate support table 6 heats the wafer W at a predetermined temperature for soft baking in step S3. Then, the main carrying device A2 carries the wafer W processed by the soft baking process out of the heating unit 25. Then, the wafer W is cooled by a cooling unit, not shown, included in the shelf unit. The cooled wafer is carried through a transfer unit included in the shelf unit U3 into the interface unit B3 by the first substrate carrying device 30A. Then, the second substrate carrying device 30B carries the wafer W to the transfer stage 37A. A carrying device, not shown, included in the exposure unit B4 carries the wafer through the wafer transfer opening 36 into the exposure unit B4. Then, in step S4, the wafer W is subjected to an immersion exposure described in connection with the back ground art by an exposure apparatus 1 disposed opposite to the wafer W.

The wafer W processed by the immersion exposure process is carried to and placed on the transfer stage 37B by a carrying device, not shown. The second substrate carrying device 30B takes up the wafer W from the transfer stage 37B, and the first substrate carrying device 30A carries the wafer W into the heating and cooling unit 35 (PEB 35). Then, the wafer W is cooled by the cooling device of the heating and cooling unit 35. Then, the wafer W is mounted on the substrate support table and is heated at a predetermined temperature to diffuse an acid generated by an acid generator contained in the resist in the resist film by the PEB process in step S5. The chemical interaction of the components of the resist is promoted by the catalytic action of the acid. Exposed parts of the resist film become dissolvable in the developer when the resist film is made of a positive resist or become undissolvable in the developer when the resist film is made of a negative resist.

The first substrate carrying device 30A carries the wafer W processed by the PEB process out of the heating and cooling unit 35. Then, the wafer w is carried through the transfer unit of the shelf unit U3 to the processing unit B2. In the processing unit B2, the main carrying device A3 carries the wafer W into the developing unit 28 (DEV 28). The wafer W is processed by the developing process in the developing unit 28 in step S6. The developer pouring nozzle of the developing unit 28 (DEV 28) pours the developer onto the wafer W. Consequently, dissolvable parts of the resist film dissolve in the developer and a predetermined resist pattern is formed. Then, the wafer W is rinsed with a rinsing liquid, such as pure water. The rinsed wafer W is dried by a spin drying process that rotates the wafer W to expel the rinsing liquid from the wafer W by centrifugal force. A drying gas blowing nozzle for blowing a drying gas, such as dry air or dry nitrogen gas, may be placed in the unit and the wafer W may be more completely dried by blowing the drying gas against the wafer while the wafer W is held stationary or being rotated. Then the main carrying device A3 carries the wafer W out of the developing unit 28 (DEV 28). Then, the main carrying device A2 and the transfer device A1 carries the wafer W and returns the wafer W into the carrier 2 placed on the carrier table 20a to complete the series of coating and developing processes.

The coating and developing system in this embodiment cleans the wafer W coated with the resist film with the cleaning liquid supplied by the first cleaning device before subjecting the wafer W to the exposure process. Therefore, the amount of the soluble materials contained in the resist and dissolve in the transparent liquid film formed on the surface of the wafer W for immersion exposure is small. Consequently, the adhesion of the dissolved components to the surface of the lens 10 and the resultant adverse effect of the dissolved components on the refraction of the exposure light can be suppressed. Thus a circuit pattern formed of lines respectively having accurate line-widths and having high intrasurface uniformity can be printed on the resist film. When the exposed resist film is developed, a resist pattern formed of lines respectively having accurate line-widths and having high intrasurface uniformity can be formed on the wafer W. Thus the wafer W can be processed accurately in high intrasurface uniformity by the coating and developing processes.

The soluble components of the resist dissolve in water in a very short time on the order of 2 s at an initial stage of contact between the resist and water and the soluble components dissolve scarcely after the initial stage of contact between water and the resist. Therefore, only a very small amount of the soluble components of the resist dissolves in the water film when the wafer W is cleaned with the cleaning liquid before the wafer W is subjected to the immersion exposure process. However, the solvable components cannot be completely washed off the resist film and, in some cases, a very small amount of the solvable components dissolve in the liquid film. If the wafer W is cleaned by pouring the cleaning liquid irregularly onto the surface of the wafer W and the surface of the wafer W is cleaned irregularly, shot regions 13 differ from each other in the amount of the solvable components dissolved in the liquid film. Consequently, the corresponding lines of the resist patterns formed in different shot regions 13 have line-widths of different accuracies, respectively, due to the effect of the dissolved solvable components. Thus the uniform cleaning of the surface of the wafer W is important for the control of the line-width of the resist pattern. The coating and developing system in this embodiment spreads the cleaning liquid uniformly over the surface of the wafer W so that the surface of the wafer W is cleaned uniformly especially with respect to a diametrical direction. Consequently, the surface of the wafer W can be uniformly processed by the coating and developing processes.

Figure 8A:
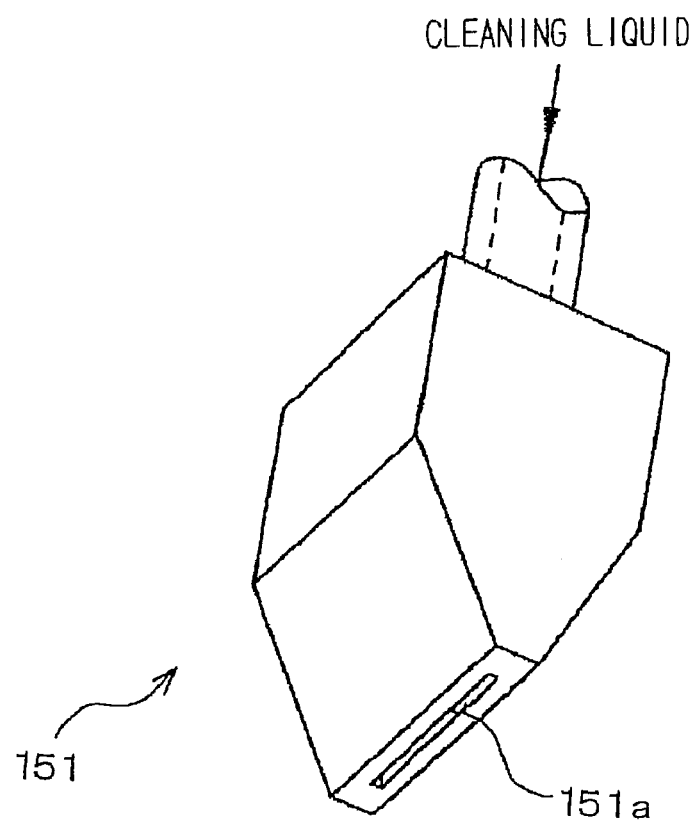
FIG. 8 is a perspective view of assistance in explaining a cleaning nozzle included in a cleaning unit.
Figure 8B:
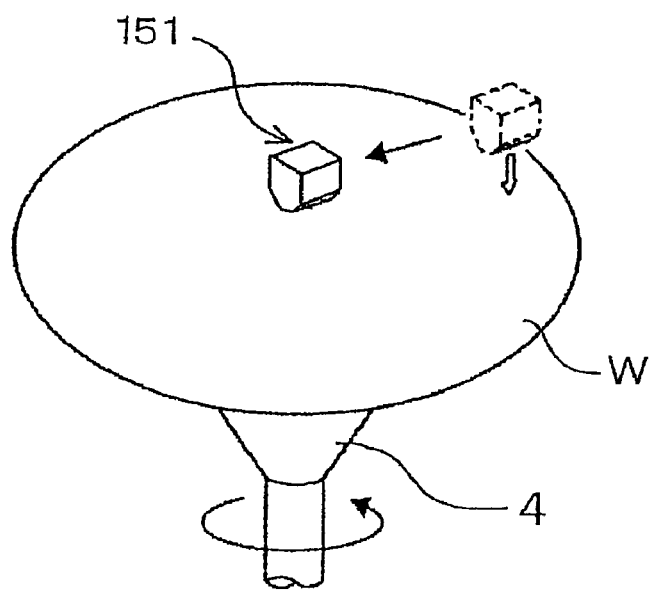

The cleaning liquid pouring nozzle 51 is not limited to such as provided with the cleaning liquid discharge slit 51a of a length equal to or greater than the diameter of the wafer W. A cleaning liquid pouring nozzle 151 provided with a cleaning liquid discharge slit 151a of a length in the range of 8 to 15 mm as shown in FIG. 8(a) may be used instead of the cleaning liquid pouring nozzle 51. When the cleaning liquid pouring nozzle 151 shown in FIG. 8(a) is employed, the cleaning liquid pouring nozzle 151 is moved radially from a position corresponding to the circumference of the wafer W toward a position corresponding to the center of the wafer W while the wafer W is being rotated about a vertical axis by the spin chuck 4 to pour the cleaning liquid spirally on the surface of the wafer W as shown in FIG. 8(b). After the cleaning liquid pouring nozzle 151 has reached the position corresponding to the center of the wafer W, the liquid pouring nozzle 151 may be moved radially outward from the position corresponding to the center of the wafer W. The operation for moving the cleaning liquid pouring nozzle radially inward and radially outward may be repeated several times. The cleaning liquid pouring nozzle 151 may be provided with discharge openings of a small diameter instead of the discharge slit 151a.

The wafer W does not need necessarily to be cleaned with the cleaning liquid prior to the soft baking process; the wafer W may be cleaned after being processed by the soft baking process. When the wafer W is cleaned after being processed by the soft baking process, the wafer W may be cleaned by an additional cleaning device provided with, for example, the cleaning liquid pouring nozzle 51 instead of by the coating unit 27 (COT 27).

Figure 9:
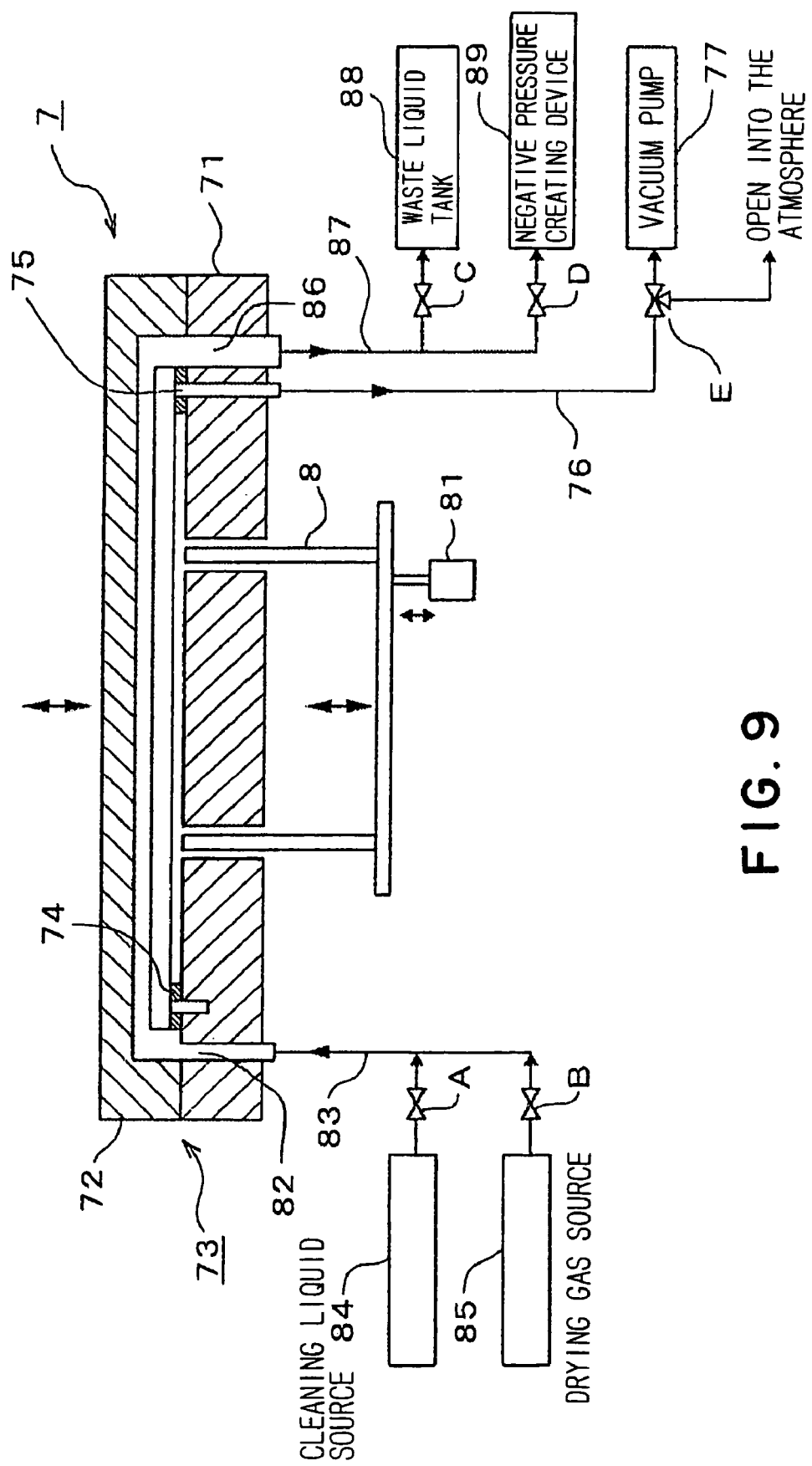
FIG. 9 is a longitudinal sectional view of a cleaning device included in a coating and developing system in a second embodiment according to the present invention.

A coating and developing system in a second embodiment according to the present invention will be described. The coating and developing system in the second embodiment is identical in construction with the coating and developing system in the first embodiment shown in FIGS. 1 and 2, except that the former is provided with a first cleaning unit including a cleaning device 7 of a closed type. Only the cleaning device 7 of a closed type of the first cleaning unit will be described and the general description of the coating and developing system will be omitted. Referring to FIG. 9, the cleaning device 7 included in the first cleaning unit has a processing vessel 73 including a substrate support table 71 for supporting a wafer W thereon in a horizontal position and a vertically movable cover 72 that can be closely joined to the substrate support table 71. When a wafer W is placed on the substrate support table 71, a space of a thickness between, for example 2 and 3 mm is formed between the surface of the wafer W and the inner surface of the cover 72. The space between the surface of the wafer W and the inside surface of the cover 72 is a passage through which a cleaning liquid flows.

A heat-resistant support ring 74 is placed on the surface of the substrate support table 71 to support a wafer W thereon. Suction holes 75 are formed in the support ring 74 at angular intervals. The suction holes 75 communicate with a space, not shown, in the substrate support table 71. The suction holes 75 are connected to a vacuum pump 77, namely, an evacuating means, by a suction line 76. A vacuum is created in the suction holes 75 to hold a wafer W on the support ring 75 by suction and to prevent the lower surface of the wafer W from being wetted with a cleaning liquid poured onto the upper surface of the wafer W.

Three retractable support pins 8 project from the upper surface of the substrate support table 71 to support a wafer W thereon. The support pins 8 are moved vertically by a lifting device 81. A wafer carried by the main carrying device A2

(A3) is mounted on the substrate support table 71 by the cooperative operations of the main carrying device A2 (A3) and the support pins 8.

Supply holes 82 are formed in the substrate support table 71 at position near a first diametrical end part of the edge of the wafer W supported on the substrate support table 71. The cleaning liquid and a drying gas can be supplied through the supply holes 82 into the processing vessel 73. The number of the supply holes 82 is, for example, five. The supply holes 82 are arranged on an arc of a circle along the edge of the wafer W. The supply holes 82 are connected to a supply line 83. The supply line 83 is connected to a cleaning liquid source 84 and a drying gas source 85, such as a dry air source of a dry nitrogen gas source, by branch lines. A discharge hole 86 is formed in the substrate support table 71 at a position near a second diametrical end part of the edge of the wafer W supported on the substrate support table 71. The discharge hole 83 is connected to a discharge line 87. The discharge line 87 is connected to a waste liquid tank 88 and a negative pressure creating device 89, such as an ejector, by branch lines. The supply holes 82 serves as both a cleaning liquid supply means and a drying means. The discharge hole 86 serves as a draining means. In FIG. 9, indicated at A to E are valves. The vale E is a three-way valve. The valve E is operated to connect the suction line 76 to the vacuum pump 77 or to open the suction line 76 into the atmosphere. The condition of the valves A to E is controlled on the basis of a sequence table stored in, for example, a computer included in a controller, not shown.

Figure 10:
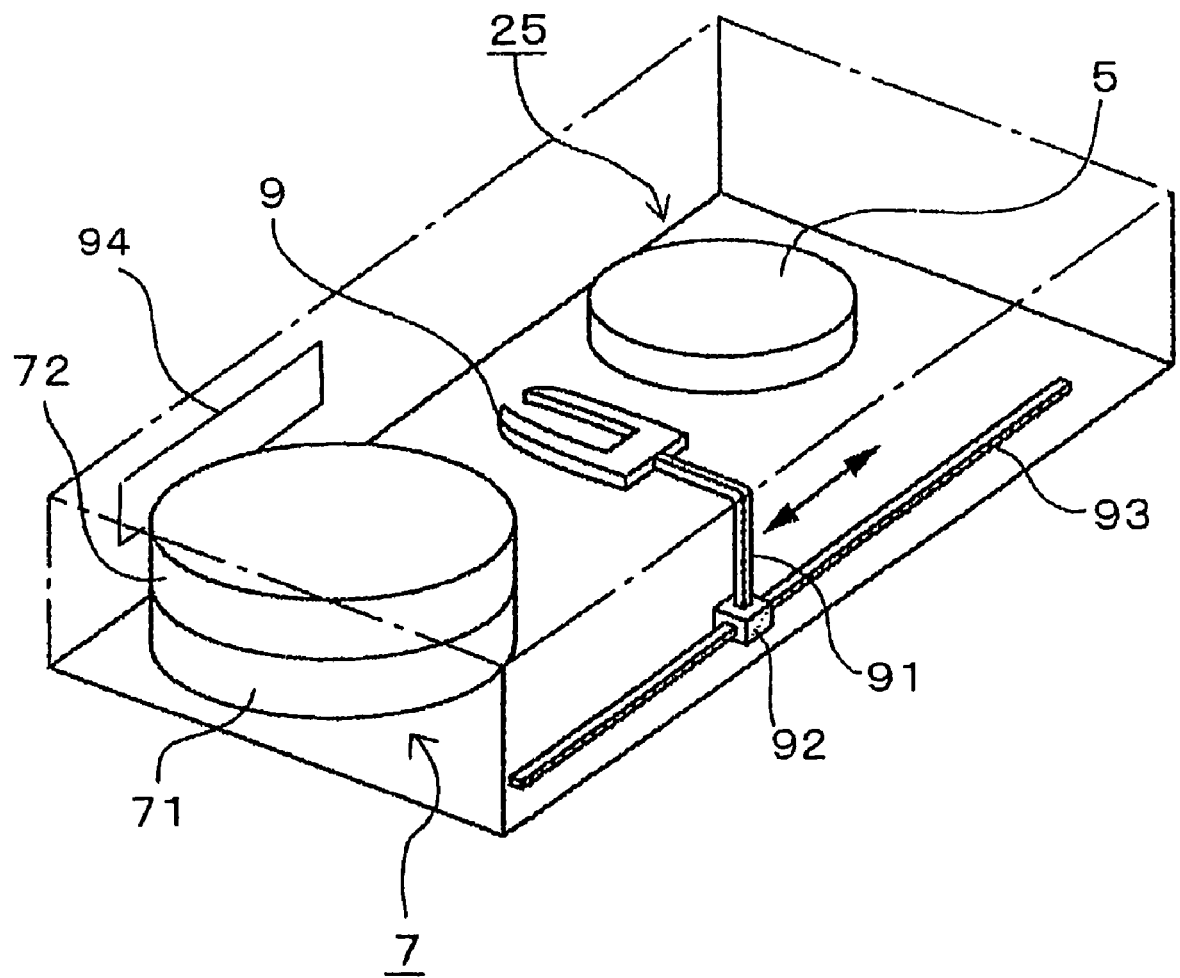
FIG. 10 is a perspective view of assistance in explaining the arrangement of the cleaning device shown in FIG. 9.

Referring to FIG. 10, the cleaning device 7 is disposed in combination with the heating unit 25. Preferably, a special carrying device is used to transfer a wafer W between the heating unit 25 and the cleaning device 7. A carrying member 9 supports a wafer W thereon and moves vertically and horizontally. The carrying member 9 is held by an arm 91 on a slider 92. The slider 92 is driven by a driving mechanism, not shown, for movement along a guide rail 93. A wafer W is carried into the cleaning device 7 through an opening 94 by, for example, the main carrying device A2 (A3).

Figure 11:
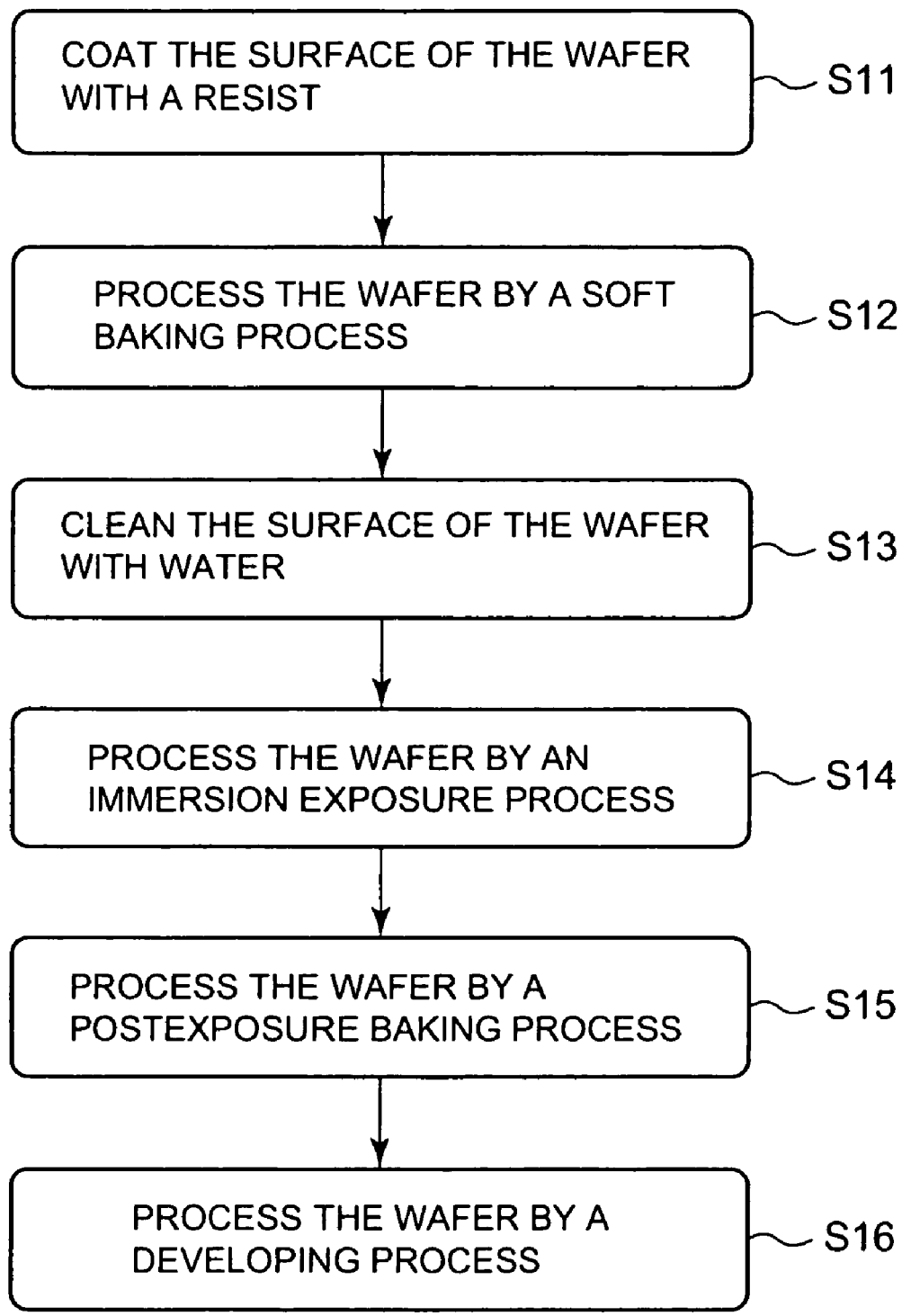
FIG. 11 is a flow chart of another wafer processing process to be carried out by the coating and developing system in the second embodiment.

The first cleaning device carries out the cleaning process after soft baking and before exposure. For example, as shown in FIG. 11, the coating process (step S1), the soft baking process (step S12), the cleaning process (step S13), the immersion exposure process (step S14), the PEB process (step S15) and the developing process (step S16) are executed in that order. The processes shown in FIG. 11 are the same as those shown in FIG. 7. However, the order of the processes shown in FIG. 11 is different from that of the processes shown in FIG. 7. The cleaning process to be carried out in step S13 will be described. The cover 72 is held at its upper position. The main carrying device A2 carries a wafer W coated with a resist film formed by the coating unit 27 (COT 27) into the cleaning device 7 through the opening 94 and places the wafer W on the support pins 8. Then, the carrying member 9 supports the wafer W and carries the wafer W onto the substrate support table 6 of the heating unit 25 (PAB 25). The wafer W is processed by the soft baking process.

Figure 12A:
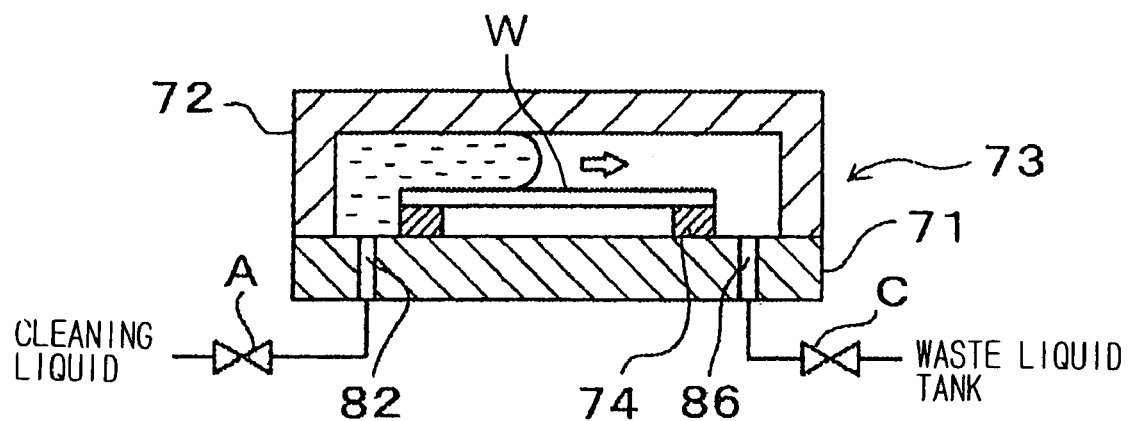
FIG. 12 is a sectional view of assistance in explaining a cleaning step of cleaning a wafer by the cleaning device shown in FIG. 9.
Figure 12B:
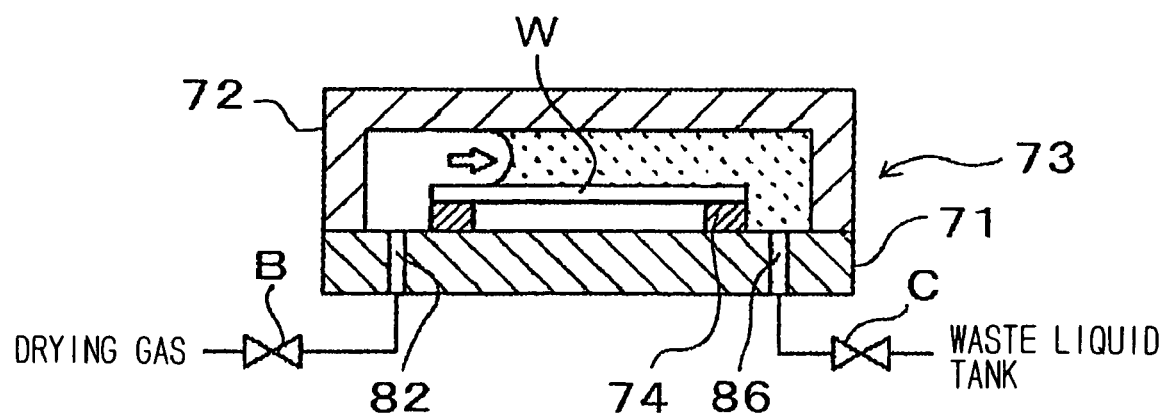

Then, the carrying member 9 carries the wafer W into the cleaning device 7. The wafer W is mounted on the substrate support table 71 by the cooperative operations of the carrying member 9 and the substrate support pins 8. Then, the vacuum pump 77 is operated to create a vacuum in the suction holes 75. Consequently, the wafer W is attracted to and held on the support ring 74 by suction. Then, the cover 72 is joined to the substrate support table 71 to close the processing vessel 73 holding the wafer W therein. Thus a passage for the cleaning liquid is formed between the surface of the wafer W and the cover 72. Then, as shown in FIG. 12(*a*), the valves A and C are opened to clean the wafer W by passing a cleaning liquid of a predetermined temperature through the processing vessel 73. In some cases, the valves A and C are closed after the processing vessel 73 has been filled up with the cleaning liquid to clean the wafer W by stationary cleaning.

After the wafer W has been cleaned, the valve A is closed and the valve B is opened to supply a drying gas into the processing vessel 73. For example, as shown in FIG. 12(*b*), the drying gas forces the cleaning liquid to flow through the discharge hole 86 into the waste liquid tank 88. Then, the valve B is closed or the opening of the valve B is reduced to supply the drying gas at a low rate into the processing vessel 73, the valve C is closed and the valve D is opened. Consequently, the pressure in the processing vessel 73 is decreased to dry the wafer W by drying under reduced pressure. After the wafer W has been dried, the valve D is closed and the valve B is opened to adjust the pressure in the processing vessel 73 to the atmospheric pressure. Then, the cover 72 is raided to open the processing vessel 73. Then, the valve E is opened into the atmosphere to break the vacuum in the suction holes 75, the substrate support pins 8 are raised to push up the wafer W. Then, the main carrying device A2 (A3) carries the wafer W out of the cleaning device 7 through the opening 94. Then, the wafer w is subjected to the exposure process. Thus the cleaning device 7 exercises the same cleaning effect as the foregoing cleaning device. When the cleaning liquid of, for example, 23° C. is used, the cleaning device 7 serves also as a cooling unit for cooling the wafer W after soft baking. The use of the cleaning device 7 for both cleaning and cooling the wafer W is effective in reducing the number of units. The cleaning device 7 may be used for cleaning the wafer W with the cleaning liquid before the wafer W is subjected to the soft baking process.

Figure 13A:
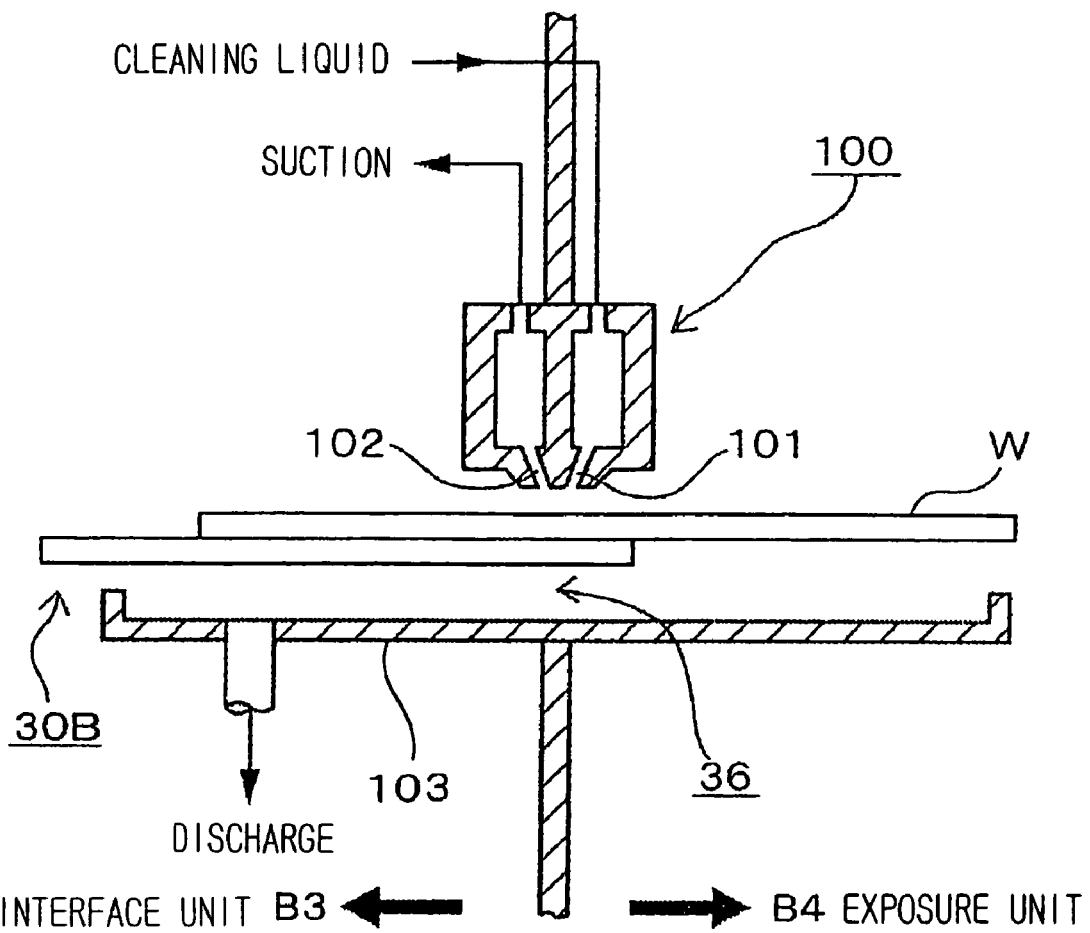
FIG. 13 is a schematic longitudinal sectional view of a cleaning device included in the coating and developing system in the second embodiment.
Figure 13B:
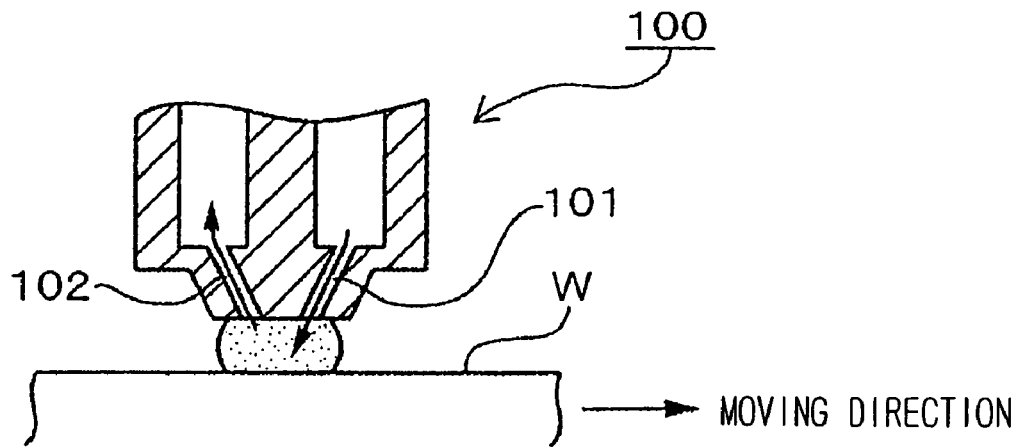

A coating and developing system in a third embodiment according to the present invention will be described. The coating and developing system in the second embodiment is identical with the coating and developing system shown in FIGS. 1 and 2 in construction, except that the former includes a first cleaning device placed in a wafer carrying path. Therefore, the description and illustration of the general construction of the coating and developing system in the third embodiment will be omitted. Referring to FIG. 13(*a*), a cleaning liquid pouring nozzle 100 is disposed at an upper position in the wafer transfer opening 36 through which a wafer W is transferred between the interface unit B3 and the exposure unit B4. The cleaning liquid pouring nozzle 100 is provided with a cleaning liquid discharge slit 101 of a length equal to or greater than the diameter of the wafer W. The diameter of the wafer W corresponds to the width of a substrate. The cleaning liquid of a predetermined temperature supplied from the cleaning liquid source, not shown, is discharged through the cleaning liquid pouring slit 101. The cleaning liquid pouring nozzle 100 is provided with a cleaning liquid sucking slit 102 of a size equal to that of the cleaning liquid discharge slit 101. The cleaning liquid sucking slit 102 is formed on the side of the interface unit B3 with respect to the cleaning liquid discharge slit 101, i.e., behind the cleaning liquid discharge slit 101. The cleaning liquid discharged through parts of the cleaning liquid discharge slit 101 not corresponding to the wafer W is collected in a drain pan 103.

Referring to FIG. 13(*b*), when the arm 32B of the second substrate carrying device 30B carries the wafer W to be subjected to immersion exposure through the wafer transfer opening 36 into the exposure unit B4, the wafer W moves under the cleaning liquid pouring nozzle 100. The cleaning liquid is poured onto the wafer W moving under the cleaning liquid pouring nozzle 100 to clean the wafer W and the cleaning liquid used for cleaning the wafer W is sucked through the cleaning liquid sucking slit 102 to recover the used cleaning liquid. The first cleaning device exercises the same effect as the foregoing cleaning device.

The coating and developing system may be provided with a first cleaning device for cleaning the wafer W before exposure and a second cleaning device for cleaning the wafer W after exposure. More concretely, the cleaning device 7 shown in FIG. 9 is installed in the interface unit B3 to clean the wafer W before and after exposure. The cleaning device 7 serves as both the first and the second cleaning device.

Figure 14:
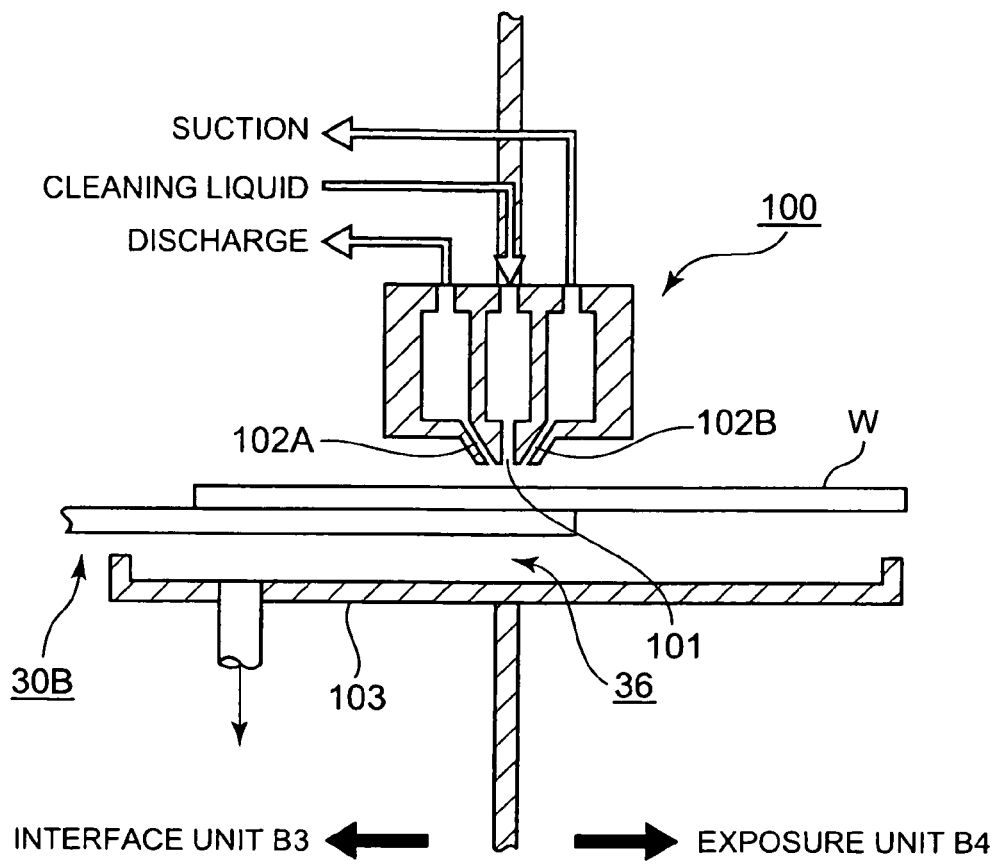
FIG. 14 is a schematic longitudinal sectional view of a cleaning device in a modification of the cleaning device shown in FIG. 13.

Cleaning liquid sucking slots 102A and 102B may be formed on the back and the front side, respectively, of the cleaning liquid discharge slit 101 as shown in FIG. 14. The cleaning liquid poured onto the wafer W through the cleaning liquid discharge slit 101 is sucked through the cleaning liquid sucking slit 102A extending behind the cleaning liquid discharge slit 101 with respect to a direction in which the wafer W is advanced to recover the cleaning liquid when the wafer W is carried into the exposure unit B4. The cleaning liquid poured onto the wafer W through the cleaning liquid discharge slit 101 is sucked through the cleaning liquid sucking slit 102B extending behind the cleaning liquid discharge slit 101 with respect to a direction in which the wafer W is advanced to recover the cleaning liquid when the wafer W processed by the immersion exposure process is returned to the interface unit B3.

The coating and developing system in the third embodiment has the following effect in addition to an effect of cleaning the wafer W before exposure by the first cleaning device. Even if the liquid used for forming the liquid film for immersion exposure remains in drops on the surface of the wafer W and the drops are contaminated with contaminants including particles while the wafer W is being carried, the wafer W can be cleared of the drops and the contaminants by the cleaning liquid poured onto the wafer W by the second cleaning device. Consequently, the clean wafer W can be subjected to the developing process and hence defects formed by the developing process can be reduced. When the wafer W is dried by the cleaning device 7, it is possible to reduce the irregularity of temperature distribution in the surface of the wafer due to the absorption of latent heat of vaporization by the cleaning liquid remaining on the wafer W. Thus a resist pattern of lines of accurate line-widths having high intrasurface uniformity can be formed on the surface of the wafer W by the series of coating and developing processes when the wafer W is cleaned after exposure.

The coating and developing system does not necessarily need to be provided with the first cleaning device serving also as the second cleaning device, and may be provided with both the first and the second cleaning device. For example, the processing unit B2 and the interface unit B3 are provided with the cleaning devices 7, respectively, the wafer W is cleaned by the cleaning device 7 of the processing unit B2 before exposure, and the wafer W is cleaned by the cleaning device 7 of the interface unit B3 after exposure. A cleaning liquid pouring nozzle 100 provided with a cleaning liquid discharge slit 101 and a cleaning liquid sucking slit 102A may be disposed so as to correspond to the transfer stage 37A, and a cleaning liquid pouring nozzle 100 provided with a cleaning liquid discharge slit 101 and a cleaning liquid sucking slit 102B may be disposed so as to correspond to the transfer stage 37B.

According to the present invention, the wafer W may be cleaned before exposure by any one of the first cleaning devices after or before soft baking or after and before soft baking. Even if the residual volatile component of the resist are vaporized and form particles during soft baking, those particles can be removed when the wafer W is cleaned after soft baking.

The substrate to be processed by immersion exposure is not limited to a wafer W and may be any one of, for example, an LCD substrate and a reticle substrate for forming a photomask.

EXAMPLES

Coating and developing methods in examples of the present invention carried out to assure the effects of the present invention will be described.

Example 1

Figure 15:
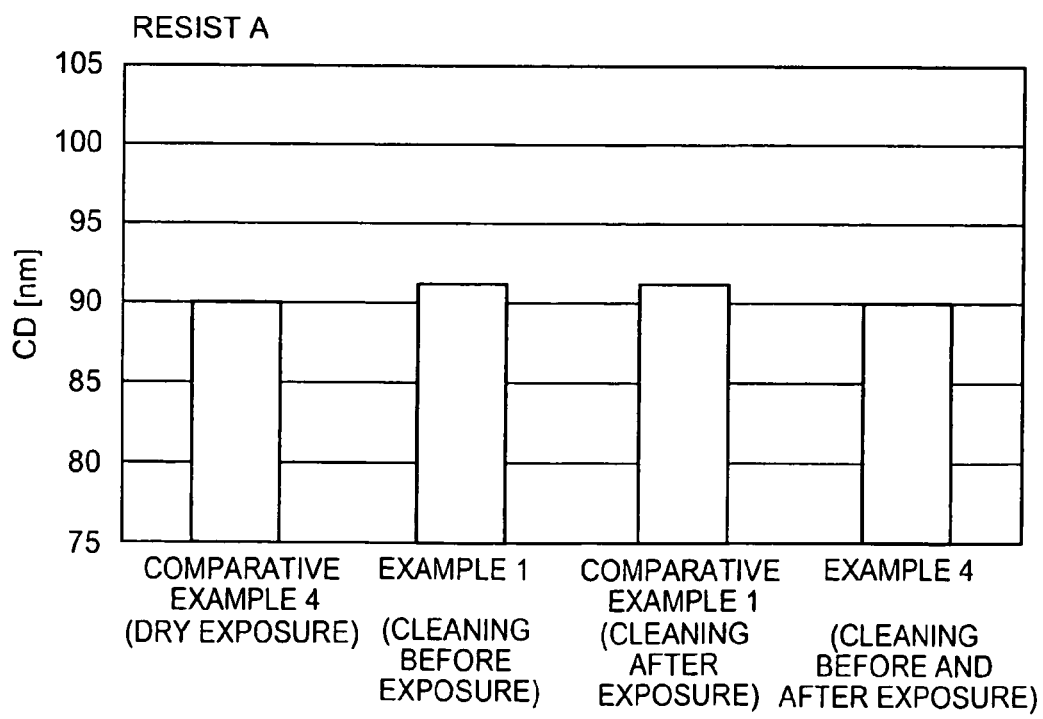
FIG. 15 is a graph showing the results of experiments conducted to confirm the effect of the present invention.

A coating and developing method in Example 1 includes a water-cleaning process for cleaning a wafer W before immersion exposure. A wafer W was subjected to a coating process for coating the wafer W with a resist A, namely, a methacrylic resist, a PAB process, a water-cleaning process (5 to 10 s), an exposure process, a PWB process and a developing process in that order. The line-widths of lines of a resist pattern formed on the wafer W were measured after development. A measured line-width is shown in FIG. 15. A desired lien-width of the lines of the resist pattern is 90 nm to explicitly indicate the difference between examples of the present invention and comparative example in the effect of cleaning. All the resist A and resists B and C are methacrylic resists containing the same resin as a principal component and respectively containing different acid generators. Although the resists A, B and C contains the same resin as their principal components, the resists A, B and C have different resist pattern forming characteristics, respectively. Experiments were conducted under the same conditions for forming resist patterns having line-widths that can be formed by the resists A, B and C.

Example 2

Figure 16:
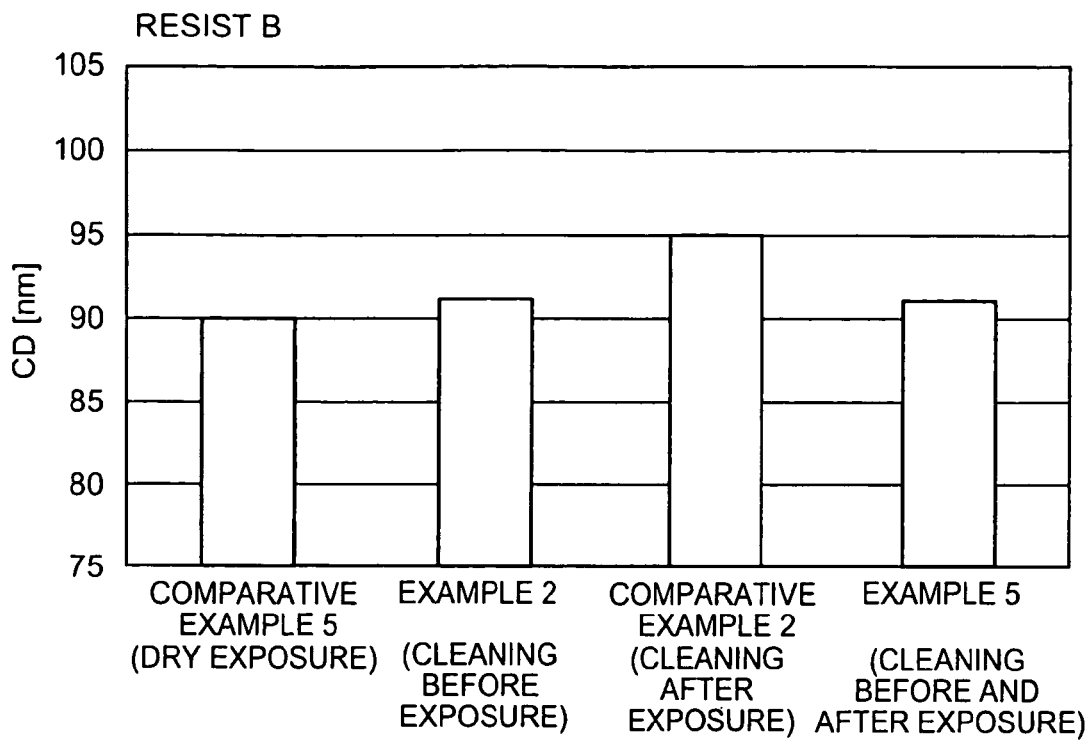
FIG. 16 is a graph showing the results of experiments conducted to confirm the effect of the present invention.

A coating and developing method in Example 2 is the same as the coating and developing method in Example 1, except that the former used the methacrylic resist B. A measured line-width is shown in FIG. 16.

Example 3

Figure 17:
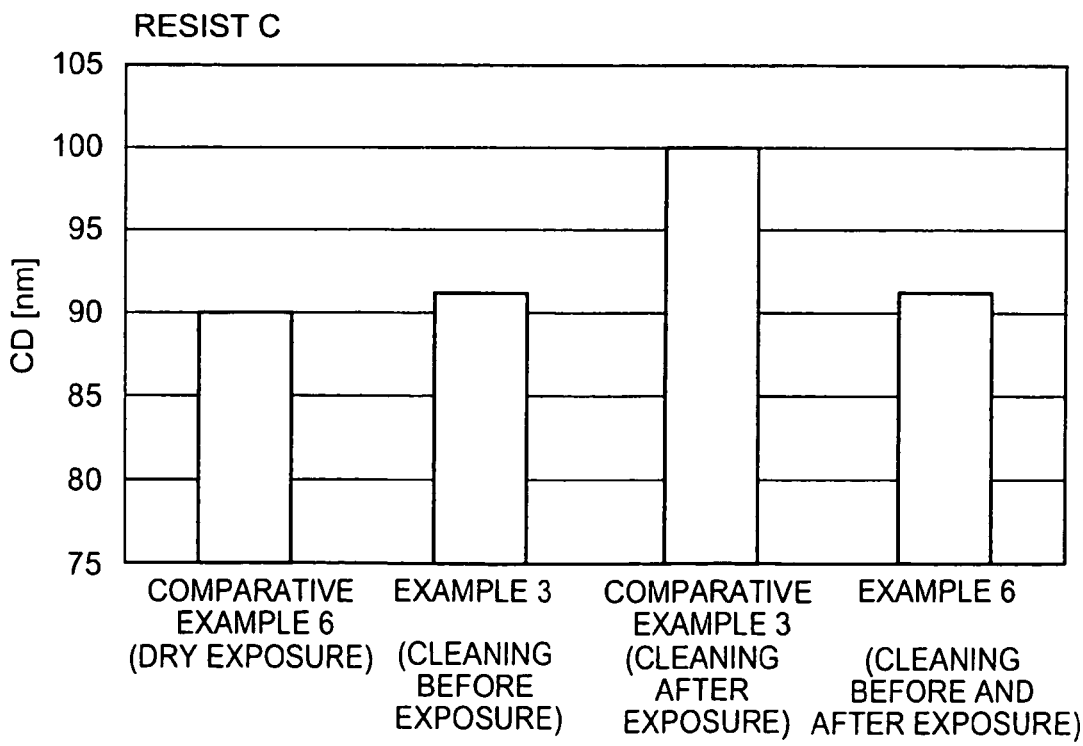
FIG. 17 is a graph showing the results of experiments conducted to confirm the effect of the present invention.
Figure 18:
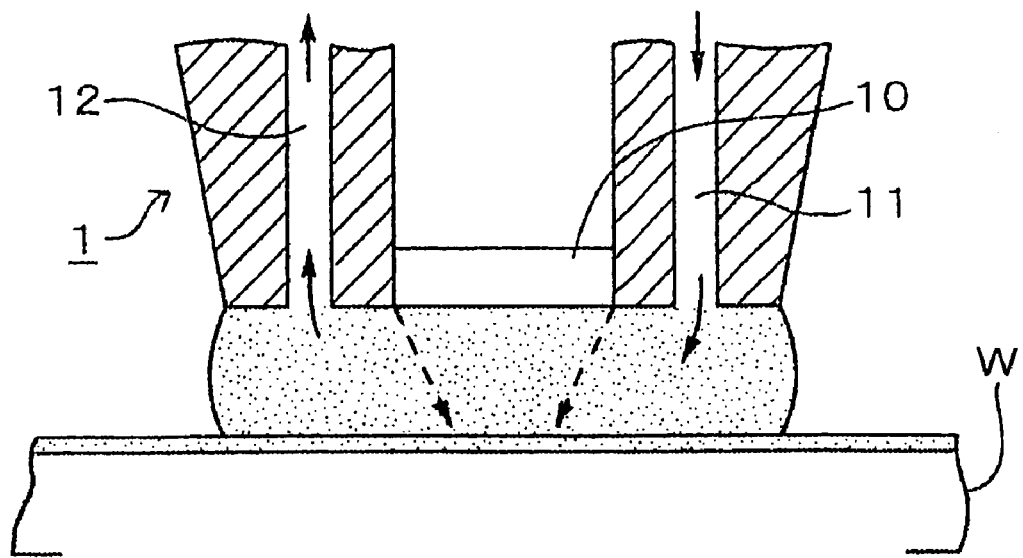
FIG. 18 is a fragmentary longitudinal sectional view of assistance in explaining an exposure system for carrying out a immersion exposure process.
Figure 19:
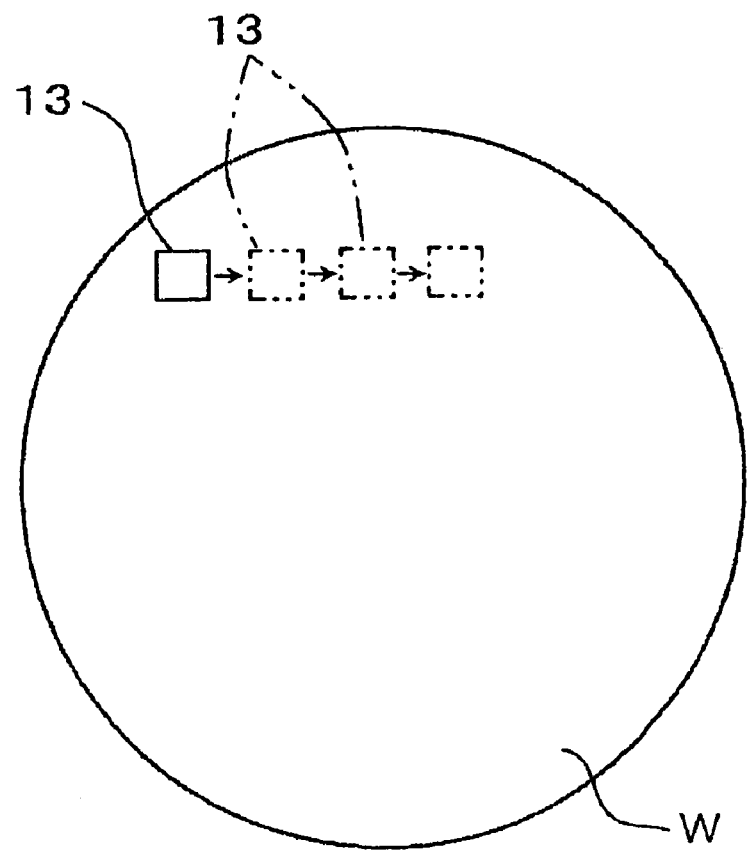
FIG. 19 is a plan view of assistance in explaining an immersion exposure process for exposing a resist film formed on a wafer by the exposure system shown in FIG. 18.

A coating and developing method in Example 3 is the same as the coating and developing method in Example 1, except that the former used the methacrylic resist C. A measured line-width is shown in FIG. 17.

Example 4

A coating and developing method in Example 4 is the same as the coating and developing method in Example 1, except that the former cleaned the wafer W with water both before and after exposure. A measured line-width is shown in FIG. 15.

Example 5

A coating and developing method in Example 5 is the same as the coating and developing method in Example 2, except that the former cleaned the wafer W with water both before and after exposure. A measured line-width is shown in FIG. 16.

Example 6

A coating and developing method in Example 6 is the same as the coating and developing method in Example 3, except that the former cleaned the wafer W with water both before and after exposure. A measured line-width is shown in FIG. 17.

Comparative Example 1

A coating and developing method in Comparative example 1 is the same as the coating and developing method in Example 1, except that the former cleaned the wafer W with water after exposure and did not clean the wafer W with water before exposure. A measured line-width is shown in FIG. 15.

Comparative Example 2

A coating and developing method in Comparative example 2 is the same as the coating and developing method in Example 2, except that the former cleaned the wafer W with water after exposure and did not clean the wafer with before exposure. A measured line-width is shown in FIG. 16.

Comparative Example 3

A coating and developing method in Comparative example 3 is the same as the coating and developing method in Example 3, except that the former cleaned the wafer W with water after exposure and did not clean the wafer with water before exposure. A measured line-width is shown in FIG. 17.

Comparative Example 4

A coating and developing method in Comparative example 4 is the same as the coating and developing method in Example 1, except that the former did not clean the wafer W with water and processed the wafer by a dry exposure process instead of by the immersion exposure process. A measured line-width is shown in FIG. 15.

Comparative Example 5

A coating and developing method in Comparative example 5 is the same as the coating and developing method in Example 2, except that the former did not clean the wafer W with water and processed the wafer by a dry exposure process instead of by the immersion exposure process. A measured line-width is shown in FIG. 16.

Comparative Example 6

A coating and developing method in Comparative example 6 is the same as the coating and developing method in Example 3, except that the former did not clean the wafer W with water and processed the wafer by a dry exposure process instead of by the immersion exposure process. A measured line-width is shown in FIG. 17.

Examination of the Results

As obvious from FIGS. 14 to 16, the line-widths of the lines of the resist patterns of the resists A, B and C formed by the coating and developing methods in Comparative examples 1 to 3 which did not clean the wafer with water before exposure were 92 mm, 95 mm and 100 mm, respectively. The line-widths of the lines of the resist patterns of the resists A, B and C formed by the coating and developing methods in Examples 1 to 3 which cleaned the wafer with water before exposure were 92 mm. The line-widths of the lines of the resist patterns of the resists A, B and C formed by the coating and developing methods in Examples 4 to 6 which cleaned the wafer with water both before and after exposure were approximately equal to those of the lines of the resist patterns formed by the coating and developing methods in Examples 1 to 3. The results of experiments proved that the lines of the resist pattern can be formed in accurate line-widths in high intrasurface uniformity regardless of the type of the resist when the wafer is cleaned with water before immersion exposure. The line widths of the lines of the resist patterns of the resists A, B and C formed by the coating and developing methods in Comparative examples 4 to 6 which did not carry out immersion exposure were about 90 mm. Therefore, it is inferred that substances contained in the resist and dissolved in water affected adversely to the accuracy of the line-widths of the lines of the resist pattern formed by the coating and developing method in Comparative examples 1 to 3. It is known from the deterioration of the accuracy of the line-widths of the lines of the resist patterns of the resists A, B and C in the order of the resists A, B and C proved that the effect of the solvable components of the resist is dependent on the characteristic of the resist, such as a hydrophilic property.

The invention claimed is:

1. A coating and developing system comprising:
    a coating unit for coating a surface of a substrate with a resist,
    a developing unit for processing the substrate by a developing process after exposing the substrate coated with a transparent liquid layer, and
    a first cleaning means for cleaning the surface of the substrate coated with the resist to remove components of the resist that may dissolve in the liquid layer when the surface of the substrate coated with the resist comes into contact with the liquid layer with a cleaning liquid before exposure, wherein the first cleaning means comprises:
    a substrate holding device for holding the substrate in a horizontal position,
    a cleaning nozzle provided with pouring openings arranged along the width of the substrate to pour the cleaning liquid onto the surface of the substrate held by the substrate holding device, and suction openings arranged adjacently to the pouring openings on a front and/or a back side of the pouring openings to suck up the cleaning liquid from the surface of the substrate, and
    a cleaning nozzle moving means for horizontally moving the cleaning nozzle relative to the substrate holding device.

2. The coating and developing system according to claim 1, wherein the coating unit comprises:
    a substrate holding device capable of holding the substrate in a horizontal position and of rotating the substrate about a vertical axis,
    a resist pouring nozzle for pouring the resist onto the surface of the substrate held by the substrate holding device.

3. The coating and developing system according to claim 1, wherein the first cleaning means comprises:
    a closely closable vessel capable of holding the substrate therein,
    a substrate support device disposed in the closely closable vessel and capable of holding the substrate in a horizontal position thereon,
    a cleaning liquid supply means for supplying a cleaning liquid into the closely closable vessel, and
    a cleaning liquid discharging means for discharging the cleaning liquid.

4. The coating and developing system according to claim 3, further comprising a heating unit for heating the surface of the substrate coated with the resist,
  wherein the first cleaning means is adjacent to the heating unit.

5. The coating and developing system according to claim 3, further comprising a drying means for drying the substrate by flowing a dry gas through the closely closable vessel after the cleaning liquid has been discharged from the closely closable vessel.

6. The coating and developing system according to claim 1, wherein the first cleaning means is provided with a drying means for removing the cleaning liquid remaining on the substrate to dry the substrate.

7. The coating and developing system according to claim 1, further comprising an interface unit for transferring the substrate coated with the resist to an exposure system and receiving the exposed substrate from the exposure system,
  wherein the first cleaning means is included in the interface unit.

8. The coating and developing system according to claim 1, further comprising a second cleaning means for cleaning the surface of the exposed substrate with a cleaning liquid before subjecting the substrate to a developing process.

9. The coating and developing system according to claim 8, wherein the first cleaning means serves also as the second cleaning means.

10. A coating and developing method comprising:
  a coating process for coating a surface of a substrate with a resist,
  a first cleaning process for cleaning the surface of the substrate coated with the resist to remove components of the resist that may dissolve in the liquid layer when the surface of the substrate coated with the resist comes into contact with the liquid layer with a cleaning liquid before exposure,
  an exposure process for exposing the surface of the substrate coated with a transparent liquid layer, and
  a developing process for developing the exposed surface of the substrate,
  wherein the first cleaning process moves horizontally a cleaning nozzle provided with pouring openings through which a cleaning liquid is poured onto the surface of the substrate and sucks the cleaning liquid poured onto the substrate through suction openings arranged adjacently to the pouring openings on a front and/or a back side of the discharge openings.

11. The coating and developing method according to claim 10, wherein the coating process includes the step of supplying the resist onto the surface of the substrate held in a horizontal position by a substrate holding device, and
  the first cleaning process includes the step of pouring a cleaning liquid through a cleaning nozzle onto the surface of the substrate held by the substrate holding device.

12. The coating and developing method according to claim 10, wherein the first cleaning process includes the steps of;
  carrying the substrate into a closely closable vessel and holding the substrate in a horizontal position,
  cleaning a surface of the substrate by supplying a cleaning liquid into the closely closable vessel, and
  discharging the cleaning liquid.

13. The coating and developing method according to claim 12, further comprising the step of drying the substrate by flowing a drying gas through the closely closable vessel after discharging the cleaning liquid from the closely closable vessel.

14. The coating and developing method according to claim 10, further comprising a drying process for drying the substrate after the first cleaning process and before the exposure process.

15. The coating and developing method according to claim 10, further comprising a cleaning process for cleaning the surface of the exposed substrate with a cleaning liquid before the developing process.

16. The coating and developing method according to claim 10, further comprising a heating process for heating the substrate after the first cleaning process before subjecting the substrate to the exposure process.

17. The coating and developing method according to claim 16, further comprising a drying process for drying the substrate after the first cleaning process before subjecting the substrate to the heating process.

* * * * *